United States Patent [19]
Muramatsu

[11] Patent Number: 5,893,623
[45] Date of Patent: Apr. 13, 1999

[54] STRUCTURE AND METHOD FOR MOUNTING SEMICONDUCTOR DEVICES, AND LIQUID CRYSTAL DISPLAY

[75] Inventor: Eiji Muramatsu, Nagano-ken, Japan

[73] Assignee: Seiko Epson Corporation, Tokyo, Japan

[21] Appl. No.: 08/481,460

[22] PCT Filed: Nov. 9, 1994

[86] PCT No.: PCT/JP94/01887

§ 371 Date: Jul. 12, 1995

§ 102(e) Date: Jul. 12, 1995

[87] PCT Pub. No.: WO95/13625

PCT Pub. Date: May 18, 1995

[30] Foreign Application Priority Data

Nov. 12, 1993 [JP] Japan ................... 5-283694

[51] Int. Cl.$^6$ .................................. G02F 1/1345
[52] U.S. Cl. .................. 349/152; 345/150; 345/151
[58] Field of Search ........................ 349/150, 151, 349/152

[56] References Cited

U.S. PATENT DOCUMENTS

| | | | |
|---|---|---|---|
| 5,117,300 | 5/1992 | Wiemer | 349/150 |
| 5,402,255 | 3/1995 | Nakanishi et al. | 349/150 |
| 5,467,210 | 11/1995 | Kishigami | 349/150 |
| 5,668,700 | 9/1997 | Tagusa et al. | 349/150 |
| 5,670,994 | 9/1997 | Kawaguchi et al. | 349/150 |

FOREIGN PATENT DOCUMENTS

| | | | |
|---|---|---|---|
| 4-20933 | 1/1992 | Japan | 349/150 |
| 4-147221 | 5/1992 | Japan | . |
| 4-212495 | 8/1992 | Japan | . |
| 4-274413 | 9/1992 | Japan | . |

Primary Examiner—William L. Sikes
Assistant Examiner—Julie Ngo
Attorney, Agent, or Firm—Oliff & Berridge, PLC

[57] ABSTRACT

A semiconductor device is mounted on one of the surfaces of a circuit board. Further, an input line and an output line and at least one of an input terminal and an output terminal of the circuit board are formed on the same surface. In the case where only one of the input and output terminals is formed on the surface on which the semiconductor device mounted, the other terminal is formed on the other surface of the circuit board and is further connected with a corresponding input or output line through a via hole by an interlayer connection. Moreover, an input bus line connected to the input terminal is provided therein to connect adjoining semiconductor devices provided on the same circuit board or to connect a semiconductor device provided on a circuit board with a semiconductor device provided on another adjoining circuit board. Semiconductor devices are mounted in a liquid crystal display by connecting the output terminal of the circuit board with a corresponding LCD terminal of an LCD cell through an anisotropic conductive film. Adjacent circuit boards are connected with each other by connecting the adjoining input terminals with each other by using a wire or an FPC or the like.

37 Claims, 19 Drawing Sheets

1

STRUCTURE AND METHOD FOR MOUNTING SEMICONDUCTOR DEVICES, AND LIQUID CRYSTAL DISPLAY

TECHNICAL FIELD

This invention relates to a structure and method or mounting semiconductor devices and, more particularly, to a structure and method suitable for mounting semiconductor devices in an electronic apparatus, such as a liquid crystal display, by using a circuit board. Further, this invention relates to a liquid crystal display in which semiconductor devices for driving the liquid crystal display are mounted by using such a structure and method.

BACKGROUND ART

In the prior art, there are known methods for mounting semiconductor devices in an electronic apparatus. For example, there is a so-called TAB (Tape Automated Bonding) method for connecting tape carrier packages, on each of which semiconductor devices are mounted, in a bundle as a single connection by using TAB technology, and a COG (Chip-on-Glass) method for directly connecting semiconductor devices to interconnecting wires or lines, the pattern of which is formed on a glass substrate.

In the case of a liquid crystal display, it is typical to connect a driving semiconductor chip to the peripheral part of the panel of the liquid crystal display, which consists of X-electrodes and Y-electrodes of a matrix structure, by using the TAB method. However, in this case, input and output lines of semiconductor devices are formed on a same surface of a TAB package. Moreover, each TAB package is mounted on the outside of the liquid crystal panel. Thus, the mounting area becomes very large. This results in a large frame portion (commonly referred to as a "large death area") formed about the peripheral part of the liquid crystal display panel. Consequently, the liquid crystal display has a problem in that the entire liquid crystal display is large in size and the displaying area is relatively small.

Furthermore, a separate driving circuit board provided with an input bus line for supplying an input signal and electric power to the semiconductor devices of each TAB package is necessary. Thus, the liquid crystal display has a problem in that the death area is further expanded and the cost increases.

Moreover, in the case of directly mounting the driving semiconductor devices on the surface of the liquid crystal panel by using the COG method, the patterns of the input and output lines or the like are formed on the surface of the peripheral part of the liquid crystal panel. As a result, the mounting area of the liquid crystal panel becomes large. Similarly, as in the case of employing the TAB method, the death area becomes very large. Additionally, the liquid crystal panel is furnished with the input and output lines and the input bus line crosswise on a same surface. Consequently, the liquid crystal display has a problem in that the manufacturing cost becomes very high.

Therefore, the applicant of the instant application proposed a structure in which a liquid crystal driving LSI is mounted in a liquid crystal display through a multilayer circuit board, as described in the specification of Japanese Patent Application No. 5-2235223/1993. As illustrated in FIGS. 26 and 27, this arrangement includes a laminated circuit board 55 having an input line 57, an output line 58, and an input terminal 59 formed on a surface thereof to a predetermined position at which a driving LSI 56 is connected. An output terminal 62 for connecting a liquid crystal panel 60 to a connecting terminal 61 is formed on the back surface of the circuit board. Input bus lines 63 or the like are provided in intermediate layers. Interlayer connections are established between the output line and terminal and between the input line and terminal through a via hole 64.

With this arrangement, a driving circuit board connected to the TAB board becomes unnecessary. Consequently, the mounting area is small, and the entire liquid crystal display can be made small and thin. Furthermore, reliability is improved by reducing the number of connection points.

This laminated circuit board, however, has the following problems. Manufacturing cost becomes high because interlayer connections are made among a large number of output lines and terminals, typically 80 to hundreds per semiconductor device, through via holes. Additionally, the mounting area of the circuit board is large because a large number of via holes are bored therein. Further, because the multilayer structure has at least three layers, the manufacturing process is complex and the manufacturing cost is increased. Moreover, the liquid crystal display equipped with the LSI can not be sufficiently thinned. Furthermore, because of the difficulty in processing, it is difficult to realize a fine pitch of the output lines, which is not more than, for example, 150 μm. Therefore, the laminated circuit board can not sufficiently respond to a demand for the downsizing of electronic equipment.

SUMMARY OF THE INVENTION

Accordingly, an object of the present invention is to provide a structure and method for mounting semiconductor devices by which interlayer connections established through via holes are partly or completely excluded from a circuit board on which the semiconductor devices are mounted to reduce the mounting area and by which intermediate conductive layers for furnishing the circuit board with input and output lines and bus lines are eliminated from the circuit board to decrease the thickness thereof. By achieving the above object, the demand for compact equipment and for the downsizing of the equipment can be responded to, the manufacturing process can be simplified, and the manufacturing cost can be reduced.

Further, another object of the present invention is to provide a liquid crystal display that can minimize the frame area, i.e., the death area, of the liquid crystal panel thereof when mounting a driving LSI thereto. By achieving the above object, the displaying area can be enlarged and the size and thickness of the display can be reduced, thus responding to the demand for the downsizing of the equipment.

In accordance with the present invention, there is provided a structure for mounting semiconductor devices in an electronic apparatus, the structure comprising a plurality of circuit boards respectively provided with semiconductor devices and having two sets of input lines and a set of output lines, two sets of input terminals respectively connected to the sets of input lines, a set of output terminals connected to the set of output lines, and an input bus line interconnecting the sets of input terminals, and characterized in that the output terminal of each of the circuit boards is connected to a corresponding terminal of the electronic apparatus and that each of the circuit boards is connected with another adjoining one of the circuit boards by electrically connecting each of the sets of the input terminals of each of the circuit boards to one of the sets of the input terminals of the adjoining one of the circuit boards.

In accordance with a first embodiment of the present invention, in each of the circuit boards, the output lines, the output terminals and the input lines are formed on a first surface. The input terminals and the input bus lines are formed on the surface opposite to the first surface. Moreover, a via hole for connecting each of the input terminals to a corresponding one of the input lines is bored in each of the circuit boards. Furthermore, a bus line path for connecting the semiconductor devices of the adjoining circuit boards is formed by the input bus line.

In this case, in addition to the input bus line, a second input bus line is formed on the first surface by connecting the two sets of the input lines with each other through the terminal of the semiconductor device. Further, in the case where the inside of the semiconductor device is divided into a plurality of blocks, a same signal can be supplied to each of the blocks through the two sets of input lines and input terminals separately. Moreover, there may be provided a cascade connection by which an output of the semiconductor device corresponding to the signal input from one of the sets of input lines is sent to the semiconductor device of another circuit board through the other of the sets of input lines and is then output from the latter semiconductor device. Further, such connections among the semiconductors device, the two sets of the input terminals and the input terminals can be suitably combined with each other, if necessary.

Moreover, in accordance with a second embodiment of the present invention, in each of the circuit boards, the input lines, the input terminals, and the output lines are formed on a first surface of each of the circuit boards. The output terminals are formed on the surface opposite to the first mounting surface. Furthermore, a via hole for connecting each of the output terminals to a corresponding one of the output lines is bored in each of the circuit boards. Further, an input bus line is formed by connecting the two sets of the input lines, which are connected to the sets of the input terminals, with each other through the terminals of the semiconductor device. Similarly, a bus line path for connecting the semiconductor devices of the adjoining circuit boards with each other is formed. Additionally, in this case, there may be provided a cascade connection as in the case of the first embodiment.

Further, in accordance with another embodiment of the present invention, in each of the circuit boards, the input lines, the input terminals, the output lines, and the output terminals are formed on a first surface of each of the circuit boards. Moreover, an input bus line is formed by the input lines connecting one of the two sets of the input lines with the other set of the input terminals through the terminals of the semiconductor device. Moreover, a bus line path for connecting the semiconductor devices of the adjoining circuit boards with each other is formed. In this case, it goes without saying that there may be provided the aforementioned cascade connection.

In accordance with the present invention, with the aforementioned configuration, the number of via holes to be formed in the circuit board can be reduced. Alternatively, the via holes can be excluded therefrom. Moreover, the mounting area of the circuit board can be small and the thickness thereof can be decreased.

Further, in accordance with still another embodiment of the present invention, a plurality of semiconductor devices can be mounted on each of the aforementioned circuit boards. A plurality of semiconductor devices can be simultaneously connected to one another in a connecting process by mounting such circuit boards in an electronic apparatus.

Moreover, in accordance with the present invention, there is provided a method for mounting a semiconductor device in an electronic apparatus. This method is characterized by comprising the step of preparing a circuit board having a semiconductor device mounted on one of the surfaces thereof, by providing input and output lines of the semiconductor and one of input and output terminals provided on a same surface, and providing the other of the input and output terminals on the other of the surfaces thereof, wherein the other of the input and output terminals is connected through a via hole to the corresponding input or output line provided on the one of the surfaces, and wherein an input bus line and the input terminal are provided on the same surface. This method is characterized by further comprising the step of mounting the circuit board in the electronic apparatus by connecting the output terminal to a corresponding terminal of the electronic apparatus.

Furthermore, in accordance with the present invention, there is provided a method for mounting a semiconductor device in an electronic apparatus, which comprises the step of preparing a circuit board having a semiconductor device mounted on one of the surfaces thereof and input and output lines of the semiconductor device, input and output terminals, and an input bus line provided on a same surface and the step of packaging the circuit board in the electronic apparatus by connecting the output terminal to a terminal of the electronic apparatus.

In the case of applying the structure of the present invention for mounting semiconductor devices to a liquid crystal display, there is provided a liquid crystal display comprising a plurality of circuit boards respectively provided with the semiconductor devices and having two sets of input lines and a set of output terminals, two sets of input terminals respectively connected to the sets of the input lines, a set of output terminals connected to the set of the output lines, and an input bus line interconnecting the sets of the input terminals. The output terminal of each of the circuit boards is connected to a corresponding terminal of the electronic apparatus and each of the circuit boards is mutually connected with another adjoining one of the circuit boards by electrically connecting each of the sets of the input terminals of each of the circuit boards to one of the sets of the input terminals of the adjoining one of the circuit boards.

With this arrangement the frame portion formed on the outside of the displaying portion of the liquid crystal panel can be reduced. Thus, the displaying portion can be substantially enlarged. Consequently, a compact liquid crystal display suitable for the downsizing thereof can be obtained.

DETAILED DESCRIPTION OF PREFERRED EMBODIMENTS

Figure 1:
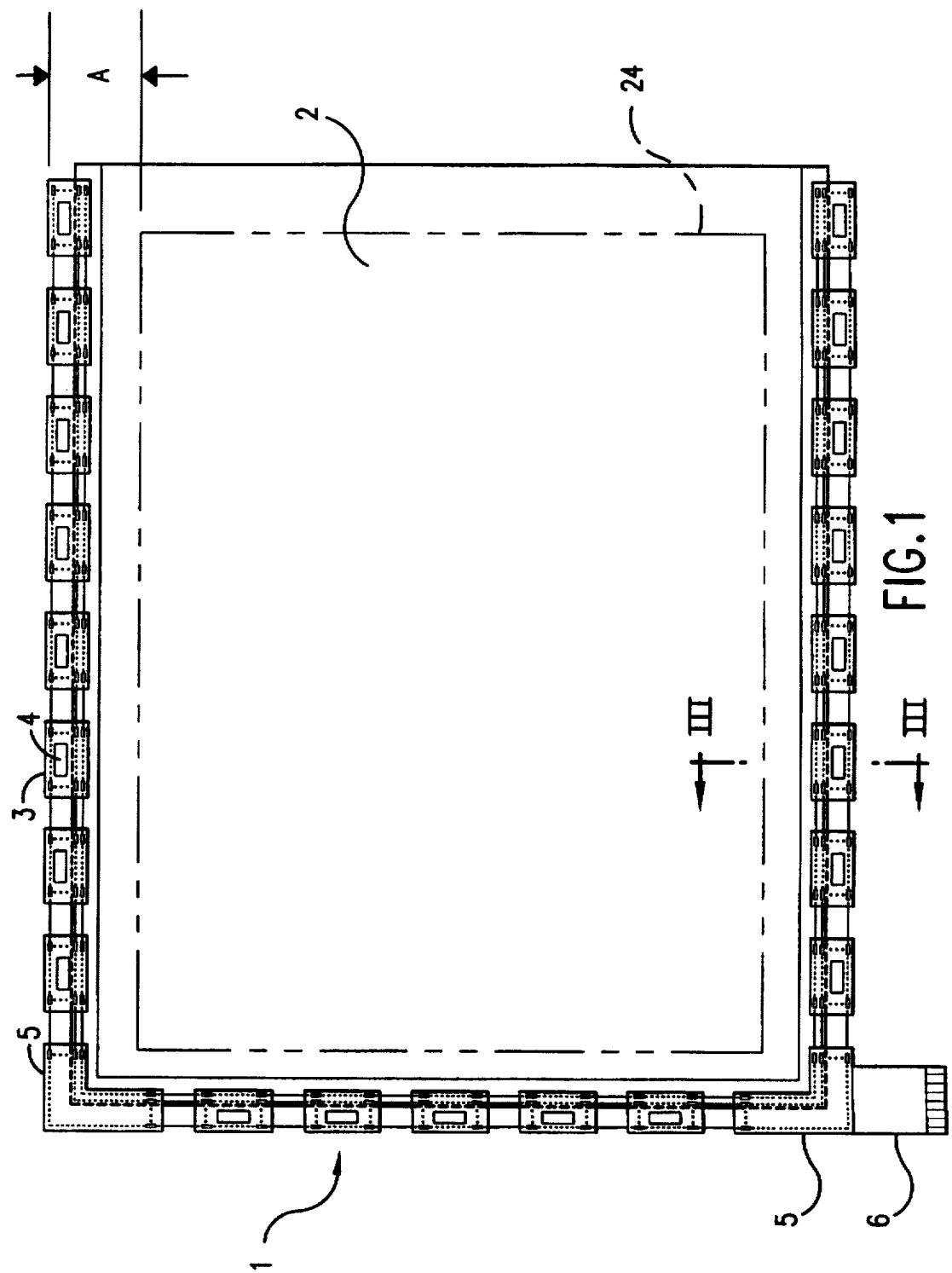
FIG. 1 is a plan view of a liquid crystal display to which the structure of the first embodiment of the present invention for mounting semiconductor devices is applied.

As illustrated in FIG. 1, in a liquid crystal display 1 to which the structure for mounting semiconductor devices according to the present invention is applied, a large number of circuit boards 3 are connected in line serially along the top, bottom, and left sides of the peripheral portion of an LCD cell 2 having X-electrodes an Y-electrodes of an ordinary matrix structure. Further, as will be described later, an X-side liquid crystal driving LSI 4 is mounted on each of the circuit boards 3 connected to the top and bottom sides of the LCD cell 2 and, on the other hand, a Y-side liquid crystal driving LSI 4 is mounted on each of the circuit boards 3 connected to the left side thereof. Moreover, a link substrate 5 for connecting the input bus line S of the circuit board provided on the X-side with the input bus line S of the circuit board provided on the Y-side is provided in the upper left corner portion and the lower left corner portion of the LCD cell 2. A cable 6 for supplying electric power and a power signal to each of the circuit boards is connected to the link substrate 5 provided on the lower left portion of the LCD cell 2.

Figure 2:
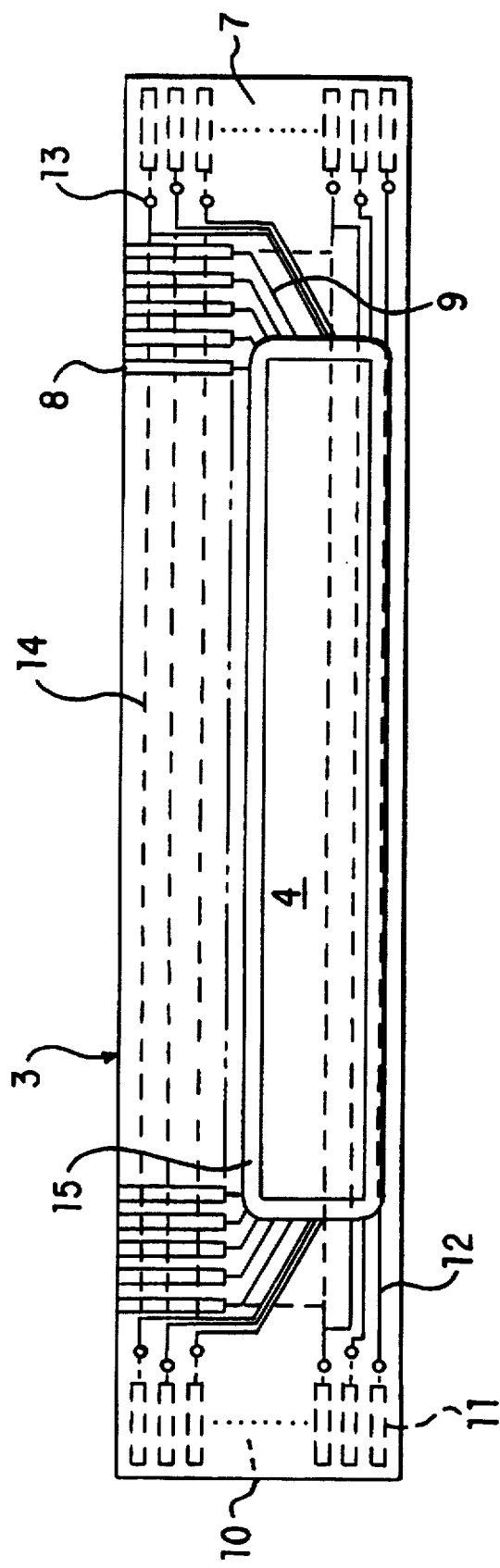
FIG. 2 is a plan view of a circuit board used in the liquid crystal display of FIG. 1.

The circuit board 3 is made of a relatively hard material such as ceramics, glass epoxy resin, or polyamide resin and is shaped like a long and narrow rectangle elongated in the longitudinal direction, as illustrated in FIG. 2. A liquid crystal driving LSI 4, which is similarly shaped like a long and narrow rectangle, is mounted at apparently the central position on a lower half of a surface 7 of the circuit board 3 along the longitudinal direction thereof through face down bonding. Naturally, in another embodiment, an LSI having an outward shape other than a rectangle, for instance, an approximately square shape, may be used if necessary. The outward form of the circuit board 3 may be changed corresponding to the shape of the LSI 4. Further, depending on conditions or requisites for use, for example, when the contents of data to be displayed in the liquid crystal display are increased and thus the frequency of a signal representing the data becomes high, it may become necessary to provide an electric grounding layer in the circuit board 3. In such a case, an electric conductive layer is provided in the circuit board 3 as the grounding layer.

On an upper half of the LSI mounting surface 7, a set of output terminals 8, the number of which is equal to that of the output terminals of the LSI 4, are formed in line at a constant pitch along the top side of the circuit board 3 in the longitudinal direction thereof. The output terminals 8 are connected to corresponding output lines 9 provided between the surface 7 and the LSI 4, respectively. Usually, the pitch of the output terminals 8 is about 100 to 200 μm or so. However, a narrow pitch equal to or less than 50 μm can be realized by appropriately selecting the material of the output terminals and the kind of film generating process.

On the surface opposite to the LSI mounting surface 7 of the circuit board 3, namely, on the back surface 10 of the circuit board 3, a set of input terminals 11, the number of which is equal to that of the input terminals of the LSI 4, are provided in line at a constant pitch along each of the left and right sides of the LSI 4. In this embodiment, the pitch of the input terminals 11 is about 100 to 300 μm or so. Further, the pattern of input lines 12 is formed in such a manner that each of the input lines 12 extends to the position of the corresponding input terminal 11 from the LSI 4 to the left or right side of the circuit board. Each of the input terminals 11 is connected to the corresponding input line 12 through a via hole 13. Thereby, the input terminals are connected to the LSI 4. The diameter of the via hole 13 is 100 μm but may be suitably changed if necessary. Further, the pattern of input bus lines 14 for connecting each of the input terminals 11 provided on the left side portion and the input terminals 11 provided on the right side portion with each other is formed on the back surface of the circuit board 3.

In this embodiment, the left and right sets of the input terminals 11 are connected to the input terminals of the LSI through the input lines 12, as illustrated in this figure. Thus, each of the input terminals 11 provided on the left side portion of the circuit board 3 and the corresponding one of the input terminals 11 provided on the right side portion thereof are connected with each other through the input lines 12 by way of the input terminals of the LSI. In this manner, second input bus lines consisting of the input lines 12 are provided on the LSI mounting surface 7 of the circuit board in addition to and parallel to the input bus lines 14 provided on the back surface 10 thereof. Consequently, the input bus lines of all of the circuit boards 3 can have a small resistance.

Where the LSI 4 is of the long, narrow, and slim type, as illustrated in FIG. 2, the inside thereof may be divided into, for example, left and right blocks, and an LSI input terminal may be provided in each of the blocks separately. In such a case, the LSI input terminal of each of the blocks is connected to the closer one of the left and right input terminals 11 through the input lines 12. Thus, a same signal is supplied to the LSIs from the left or right input terminal independently. Moreover, in accordance with this embodiment, the input terminals 11 provided on the left side portion are connected with the LSI through the input lines 12 provided on the left side portion and further outputs of the LSIs are connected with the input terminals 11 provided on the right side portion through the input lines 12 provided on the right side portion. Consequently, a cascade connection for connecting LSIs of adjoining left and right circuit boards in series may be applied thereto.

Practically, these embodiments may be appropriately combined with one another according to the requirements of the configuration of the circuit boards and the LSIs. For example, an embodiment may be constituted as follows. Namely, a part of the inside of the LSI 4 (for instance, a power supply system) is divided into blocks. A portion of the signals are input from the input terminals and lines provided on the left and right side portions, separately, and another portion of the signals are transmitted to the LSI of an adjoining circuit board through the cascade connection, for example, the input terminals and lines provided on the right side thereof. Moreover, the remaining portion of the signals are transmitted through the input bus lines consisting of the left and right input lines connected with one another by way of the input terminals of the LSI.

These lines 9, 12 and 14 and the terminals 8 and 11 are made of a single element Au. Alternatively, these lines and terminals may be formed by using AgPd, Ag, and Cu as materials of a base and by plating the base with Ni.Au, Sn, or the like if necessary. Moreover, if necessary, the surfaces of these lines and terminals are coated with a solder resist to prevent corrosion thereof and avoiding damage thereto. Similarly, the via hole 13 is made of a metal material such as Au. Alternatively, the via hole 13 may be formed by using AgPd, Ag, and Cu as materials of a base and by plating the base with Ni.Au, Sn, or the like if necessary. Moreover, if necessary, the surfaces of the via hole 13 may be coated with a solder resist. Furthermore, the LSI 4 mounted on the circuit board 3 is coated with a molding material 15 containing an adhesive, such as an ultraviolet setting type resin or a thermosetting type epoxy, if necessary. Thereby, the moisture-resistance and the insulating strength of the LSI 4 can be increased and reliability improved.

Figure 3:
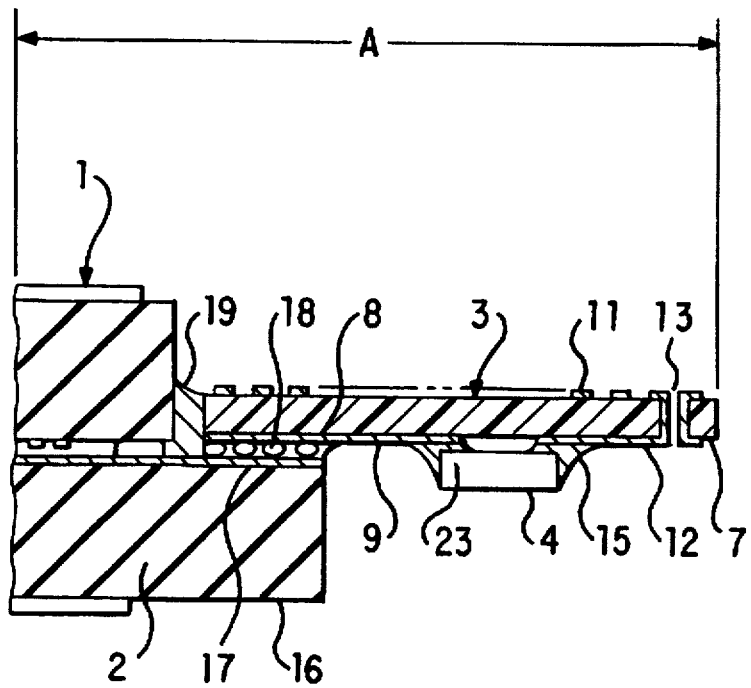
FIG. 3 is a partially enlarged sectional view taken on line III—III of FIG. 1 for illustrating how the circuit board of the first embodiment is connected to an LCD cell.

Referring to FIG. 3, there is shown a structure in which the driving LSI 4 is mounted in the liquid crystal display 1 by connecting the circuit board 3 with the LCD cell 2. Further, LCD terminals 17 connected to the electrode are formed into lines corresponding to the output terminals 8 of the circuit board 3 at a predetermined pitch on the top surface of the peripheral portion of a lower transparent electrode substrate 16, on which the electrode pattern of the LCD cell 2 is formed. Each of the LCD terminals 17 is usually made of an ITO (Indium Tin Oxide) transparent electrode. If necessary, each of the LCD terminals 17 may be plated with a metal, such as Cr, Ni, Au or Cu, or with the combination of such metals.

In the circuit board 3, the output terminals 8 are electrically and mechanically connected with the LCD terminals 17 by coordinating the position of each of the output terminals 8 to the corresponding LCD terminals 17 and simultaneously inserting an ACF, i.e. the anisotropic conductive film 18, therebetween. Thereafter, thermocompression bonding is performed on the ACF by means of a predetermined pressuring and heating tool. In this embodiment, a film of AC6000 or AC7000 series of the thermosetting type, which is manufactured by Hitachi Chemical Co., Ltd., is used as the ACF 18. Alternatively, a film of the UV setting type or a paste-like anisotropic conductive adhesive may be used as the ACF. A molding member 19 is provided at the connection portion between the LCD cell 2 and the circuit board 3.

Figure 4:
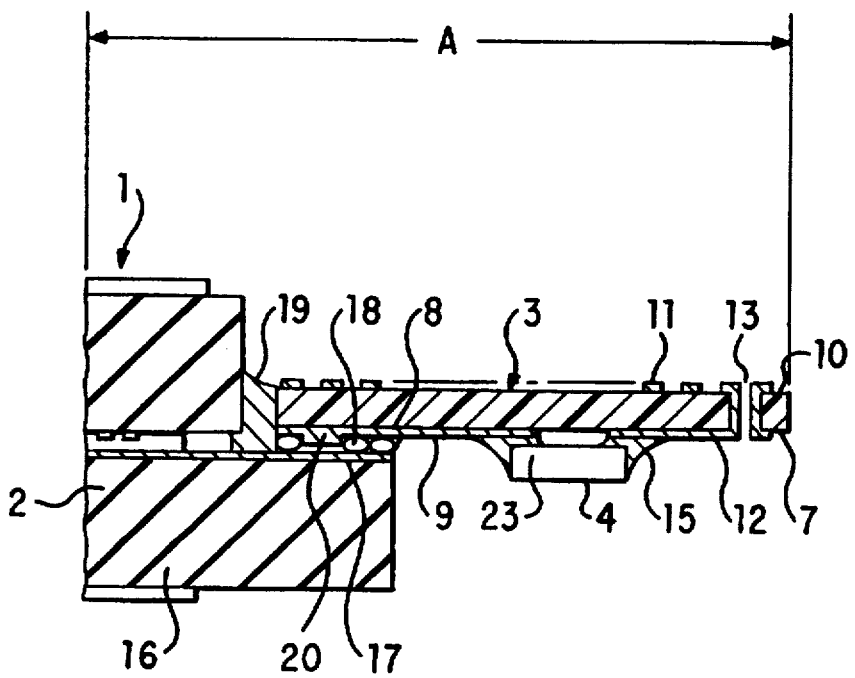
FIG. 4 is a sectional diagram for illustrating an example of the modification of the circuit board of the first embodiment similarly as in the case of FIG. 3.

In an another embodiment, a bump 20 made of Au, Cu, or the like is formed on the output terminals 8 of the circuit board 3, as shown in FIG. 4.

Figure 5:
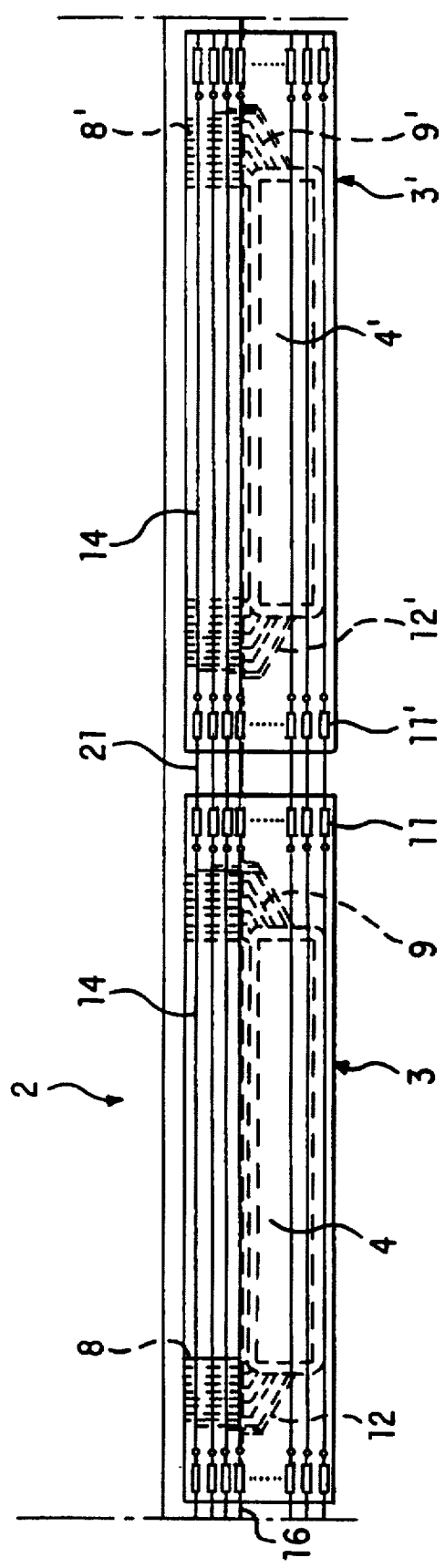
FIG. 5 is a partially enlarged diagram for illustrating how adjoining circuit boards of the liquid crystal display of FIG. 1 are connected to each other.
Figure 6:
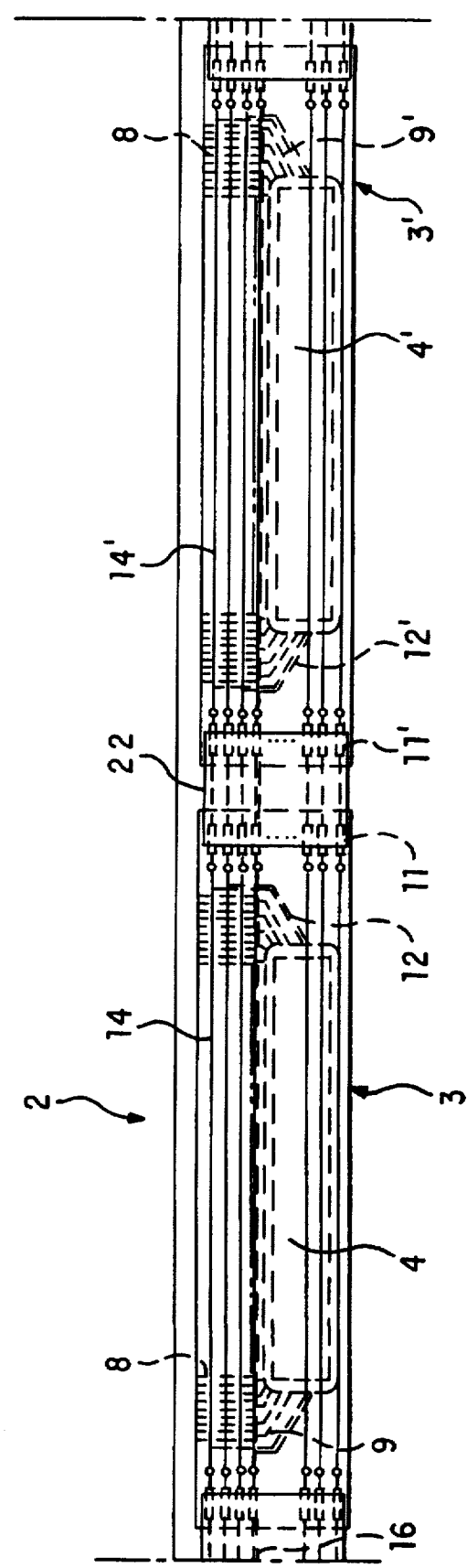
FIG. 6 is a partially enlarged diagram for illustrating another embodiment connecting circuit boards with each other by means of an FPC (Flexible Printed Circuit), similarly as in the case of FIG. 5.

As shown in FIG. 5, the adjoining circuit boards 3 and 3', which are connected to the LCD cell 2, are connected with each other by interconnecting the adjacent input terminals 11 and 11' through wire bonding by use of lines 21. Lines 21 are made of a metal, such as Au, Al and Cu, or of an alloy of such metals. Thereby, the input bus lines 14 of all the circuit boards 3 mounted serially on the circumference of the LCD cell 2 are connected with one another. For convenience in performing wire bonding on the input terminals of the adjoining circuit boards, an appropriate supporting member is provided under the circuit boards 3 and 3'. Moreover, in a further embodiment, the input terminals 11 and 11' of the adjoining circuit boards 3 and 3' can be interconnected by using an FPC 22 on the surface of which the pattern of the lines are formed, as illustrated in FIG. 6.

Further, in the aforementioned embodiment, the LSI 4 has input/output terminals 23 provided with a bump made of Au or the like and is directly connected with the input and output lines 11 and 9 of the circuit board 3 by employing a face down method. However, each input/output terminal of the LSI 4 upwardly fixed on the circuit board 3 by employing a face up method may be connected to the input and output lines through wire bonding.

Thus, in the case of the structure for mounting semiconductor devices according to the present invention, the output terminals 8 of the circuit board 3 are provided on the same surface 7 on which the LSI 4 is mounted in such a manner so as to be connected with the terminals 17 of the LCD cell 2. Thereby, there is no necessity of boring a via hole in the circuit board to connect the output lines with the corresponding output terminals. Accordingly, this arrangement is different from the mounting structure described in the specification of Japanese Patent Application No. 5-223523/1993. The number of output terminals is much larger than the number of input terminals. As described above, the number of output terminals is 80 to hundreds per semiconductor device. Thus, a compact and low-priced circuit board can be formed by eliminating the via holes for the output terminals. Moreover, the area of the circuit board can be effectively utilized. Furthermore, the degree of freedom of the wiring can be increased. Additionally, the outward form of the circuit board 3 can be small in size and the thickness thereof can be reduced by eliminating the intermediate conductive layers.

Thereby, the frame portion located in the circumferential portion of the LCD cell 2, i.e. the mounting region indicated as dimension A and provided in the displaying portion 24 of the liquid crystal display 1, can be very small in size. Further, as a result of realizing a thin circuit board 3, the thickness of the LSI 4 can be obtained within the range of the thickness of the LCD cell 2 when the circuit board is mounted on the LCD cell 2. Therefore, the structure for mounting semiconductor devices can be compact. Consequently, the entire liquid crystal display 1 can be downsized. Moreover, in the case of other embodiments, the structure of the present invention for mounting semiconductor devices can be applied to only one, two or all of the four sides of the LCD cell 2. In such cases, similar actions and effects can be obtained.

Figure 7:
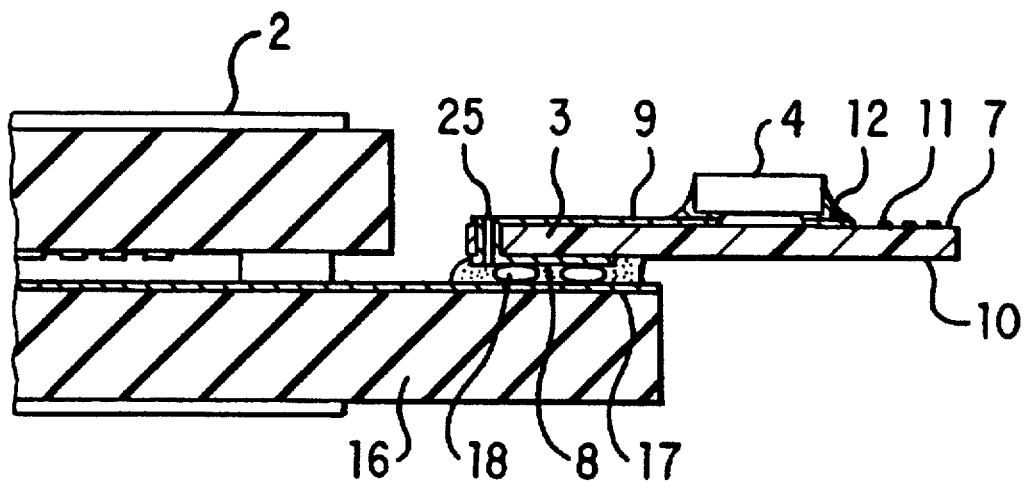
FIG. 7 is a sectional diagram for illustrating how the circuit board of the second embodiment is connected to an LCD cell, similarly as in the case of FIG. 3.

FIG. 7 shows another structure for packaging semiconductor devices, namely, the second embodiment of the present invention. The circuit board 3 of this embodiment is shaped like a long and narrow rectangle, which is nearly the same as the form of the circuit board of the first embodiment of FIG. 2. Moreover, the LCD driving LSI 4 is mounted nearly in the central portion. In addition to the output lines 9 and the input lines 12, a set of input terminals 11, the number of which is equal to that of the input terminals of the LSI 4, are formed along each of the left and right sides of the circuit board. The input terminals 11 formed along the left side and the input terminals 11 formed along the right side thereof are connected with the input terminals of the LSI 4 through the corresponding left and right input lines 12. Namely, the left and right input lines 12 for connecting the input terminals 11 provided along the left and right sides with one another through the input terminals of the LSI 4 form the input bus lines 14. Further, in this embodiment, there may be employed the combination of cascade connections, in each of which an output of the LSI corresponding to a signal input from the input line 12 provided along the left side thereof is sent to the LSI of another circuit board through the input line 12 provided along the right side thereof and is thereafter output from the latter LSI.

Similarly, as in the first embodiment, a set of output terminals 8 are formed along the top side of the surface 10 opposite to the LSI mounting surface 7 of the circuit board 3 in the longitudinal direction. This set of output terminals 8 are connected to the corresponding output lines 9 through via holes 25, respectively. The circuit board 3 is similarly electrically and mechanically connected with the LCD cell 2 by positionally coordinating each of the output terminals 8 to the corresponding LCD terminal 17 provided on the electrode substrate 16 and inserting the ACF 18 during that time and thereafter performing a thermocompression bonding thereon. In this embodiment, the adjoining circuit boards 3 are connected with each other by connecting the adjacent input terminals 11 by wire bonding or using an FPC.

In this embodiment, when designing the input lines 12, namely, the input bus lines, mounting the input lines on the LSI mounting surface 7 has an advantage in achieving a larger pitch of the input lines, as compared with mounting these lines on the opposite surface 10 which requires a bonding area to be bonded to the electrode substrate 16. If the input lines are provided on the surface 7, there is no necessity of providing a via hole for connecting the input lines with the input terminals 11. Thus, although this embodiment is not as effective as the aforementioned first embodiment, the circuit board 3 can be compact. Further, the cost can be reduced and the area of the board can be effectively utilized.

Figure 8:
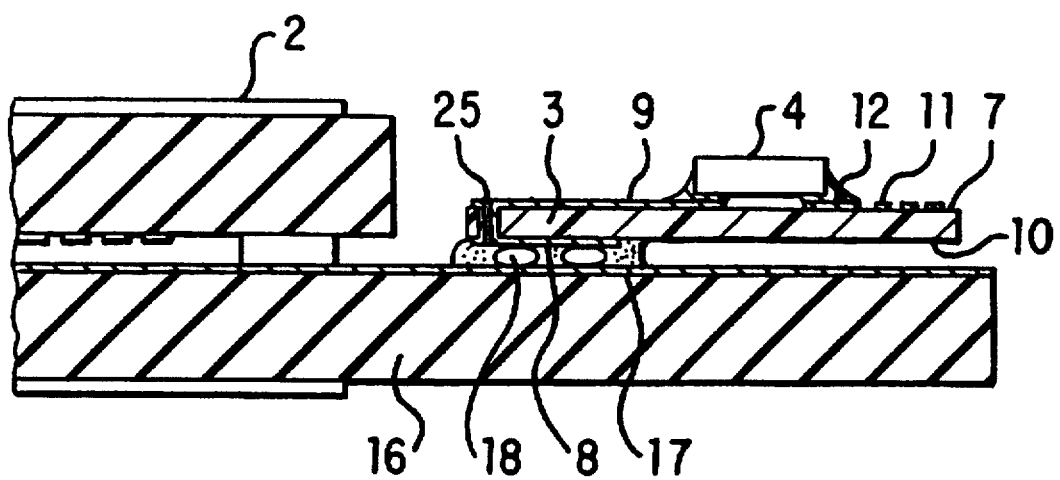
FIG. 8 is a sectional diagram for illustrating an example of the modification of the second embodiment.

FIG. 8 illustrates an example of the modification of the aforesaid second embodiment. The peripheral portion of the electrode substrate 16 is expanded to a region the horizontal section of which contains that of the entire circuit board 3. Thereby, not only the output terminals 8 but the entire bottom surface 10 of the circuit board 3 can be bonded onto the electrode panel 16. Consequently, the circuit board 3 can be mechanically connected to the LCD cell 2 even more firmly and securely.

Figure 9:
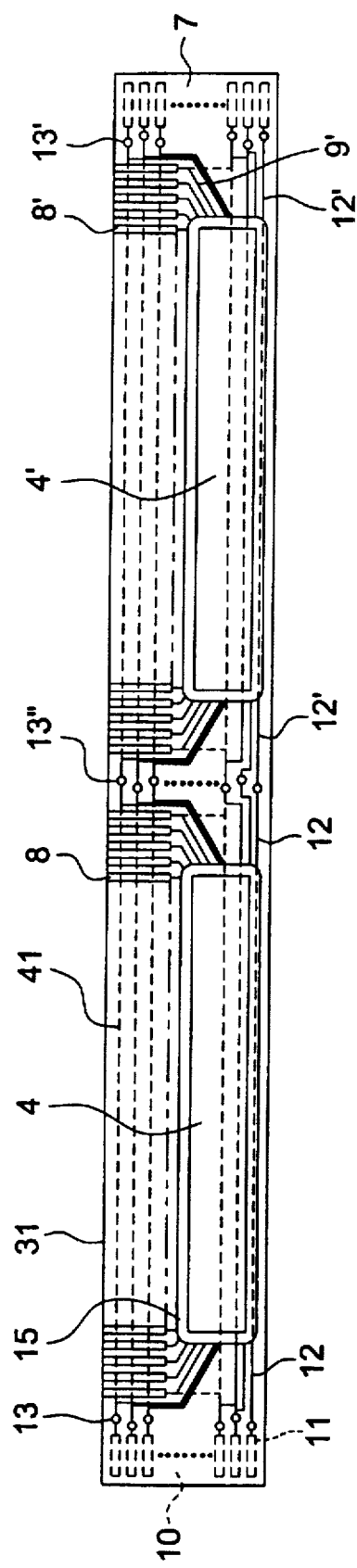
FIG. 9 is a plan view of a circuit board of a third embodiment of the present invention, on which two LCD driving LSIs are mounted.

FIG. 9 shows a third embodiment for mounting semiconductor devices in which two LCD driving LSIs are mounted on a circuit board. This circuit board 31 has a configuration similar to that of the circuit board 3 of the first embodiment. Further, the circuit board 31 is shaped like a band plate that is longer and narrower in the direction from left to right than the circuit board 3. On a surface 7 of the circuit board 31, two LSIs, 4 and 4', are mounted in series along one of the sides by performing face down bonding.

On the LSI mounting surface 7, each set of output terminals 8 and 8' of an equal number corresponding to output terminals of each of the LSIs 4 and 4' are placed in line at a constant pitch along the other side in the longitudinal direction. The output terminals of each of the sets are connected to the output lines 9 and 9', the patterns of which are formed in such a manner so as to extend from the corresponding LSIs 4 and 4', respectively. On the back surface 10 of the circuit board 3, sets of input terminals 11 and 11' of a number being equal to that of the input terminals of the LSIs 4 and 4' are placed at a constant pitch on the left and right side portions, respectively. The left and right sets of the input terminals are interconnected through input bus lines 14, the pattern of which is formed in such a manner so as to extend in the longitudinal direction on the back surface of the circuit board.

Further, on the LSI mounting surface 7, the pattern of each of the input lines 12 and 12' of the LSIs 4 and 4' is formed. The input lines 12 and 12' extending from the LSIs to the left and right side portions of the circuit board 3 are connected with the corresponding input terminals 11 and 11' through via holes 13 and 13', respectively. Moreover, the input lines 12 and 12' extending between the LSIs 4 and 4' are interconnected and are also connected with the input bus lines 14 through via holes 13.

Therefore, similar to the first embodiment, the input terminals 11 provided on the left side portion of the circuit board 31 are connected with the input terminals 11' provided on the right side portion thereof through the input lines 12 and 12' by way of the input terminals of both of the LSIs, respectively. Thereby, in addition to the aforementioned input lines 14, the second input bus lines are provided on the LSI mounting surface 7. As a result, the input bus lines can have a small resistance.

Furthermore, similar to the first embodiment, if the LSIs 4 and 4' are of the long, narrow, and slim type and the inside thereof is divided into blocks, the input terminals of the left or right block of each of the LSIs are connected with the input terminals 11 and 11' provided along the closer one of the left and right sides through the input lines 12 and 12'. Moreover, the input terminals of the other block of each of the LSIs are connected with the input bus lines 14 through the input lines 12 and 12' and the common via hole 13. Thus, a same signal is supplied to the left and right blocks independently. Further, wiring may be performed in such a manner so as to contain the following cascade connections or the combination thereof. Namely, in the cascade connection, the input terminals 11 provided along the left side are connected to the LSI 4 on the left side through the input lines 12 provided on the left side portion. Further, an output of the LSI 4 is connected to the LSI 4' on the right side through the input lines 12 and 12' provided between both of the LSIs. Moreover, an output of the LSI 4' is connected to the input terminal 11' provided along the right side through the input lines 12' on the right side portion.

The circuit board 31 is connected with the LCD cell by using an ACF and adjusting each of the output terminals 8 and 8' to the corresponding LCD terminal of the electrode substrate, as in the third embodiment. Thus, in accordance with this embodiment, two liquid crystal driving LSIs are mounted on an LCD cell in a connecting process. The input terminals of the adjoining circuit boards 31 are interconnected by performing wire bonding or by using an FPC. Thereby, a bus line path for connecting the adjoining circuit boards is formed.

Figure 10:
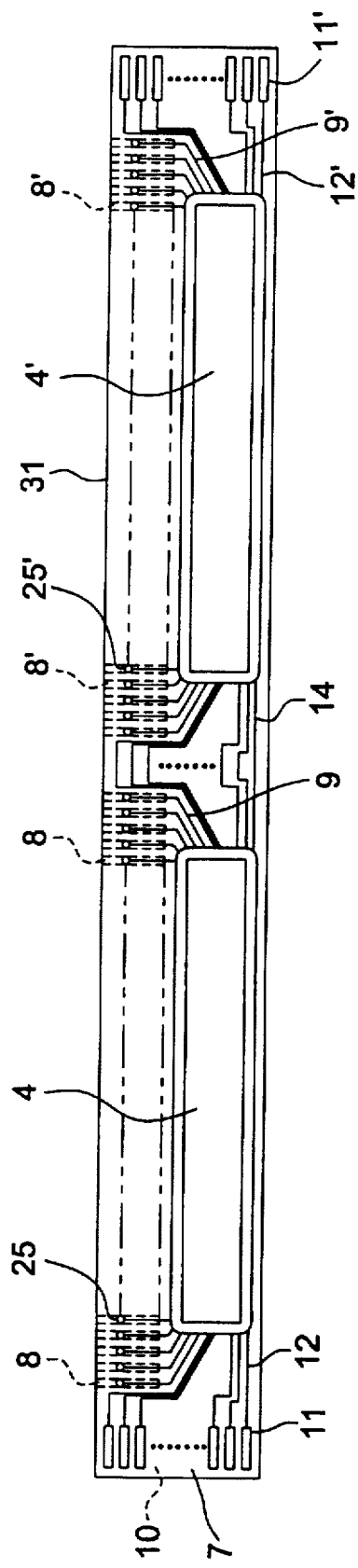
FIG. 10 is a plan view of a circuit board which is an example of the modification of the circuit board of FIG. 9.

Moreover, in the present embodiment, the circuit board 31 can be constructed so that the output terminals are provided on the LSI mounting surface similar to the second embodiment of. FIG. 10 illustrates a structure for mounting semiconductor devices that is an example of such a modification. The circuit board 31 of this figure is similarly shaped like a long and narrow band plate. Moreover, on one of the surfaces thereof, namely, the surface 7, two LSIs 4 and 4' are connected in series with each other in the longitudinal direction by performing face down bonding.

On the LSI mounting surface 7, one set of input terminals 11 or 11' are placed at a constant pitch on each of the left and right sides thereof. Morever, the pattern of input lines 12 and 12' is formed in such a manner so as to extend from each of the input terminals to each of the LSIs 4 and 4'. Furthermore, the pattern of output lines 9 and 9' of the LSIs 4 and 4' is formed in such fashion so as to extend to the top side of the LSI mounting surface 7. On the back surface 10 of the circuit board 3, sets of output terminals 8 and 8' for connecting an LCD cell therewith are placed along straight lines at positions corresponding to the output lines 9 and 9' and along a side of the circuit board in the longitudinal direction thereof. The output terminals 8 and 8' are further interconnected through via holes 25 and 25' bored through the circuit board 3.

Moreover, on the LSI mounting surface 7 of the circuit board 3, there is formed the pattern of input bus lines 14 for connecting lands, to which the input terminals of the LSIs 4 and 4' are connected, with one another. Thereby, the input terminals 11 and 11' are connected with one another through the input lines 12 and 12' and the input bus lines so that a bus line path for connecting the adjoining circuit boards with each other is formed.

Figure 11:
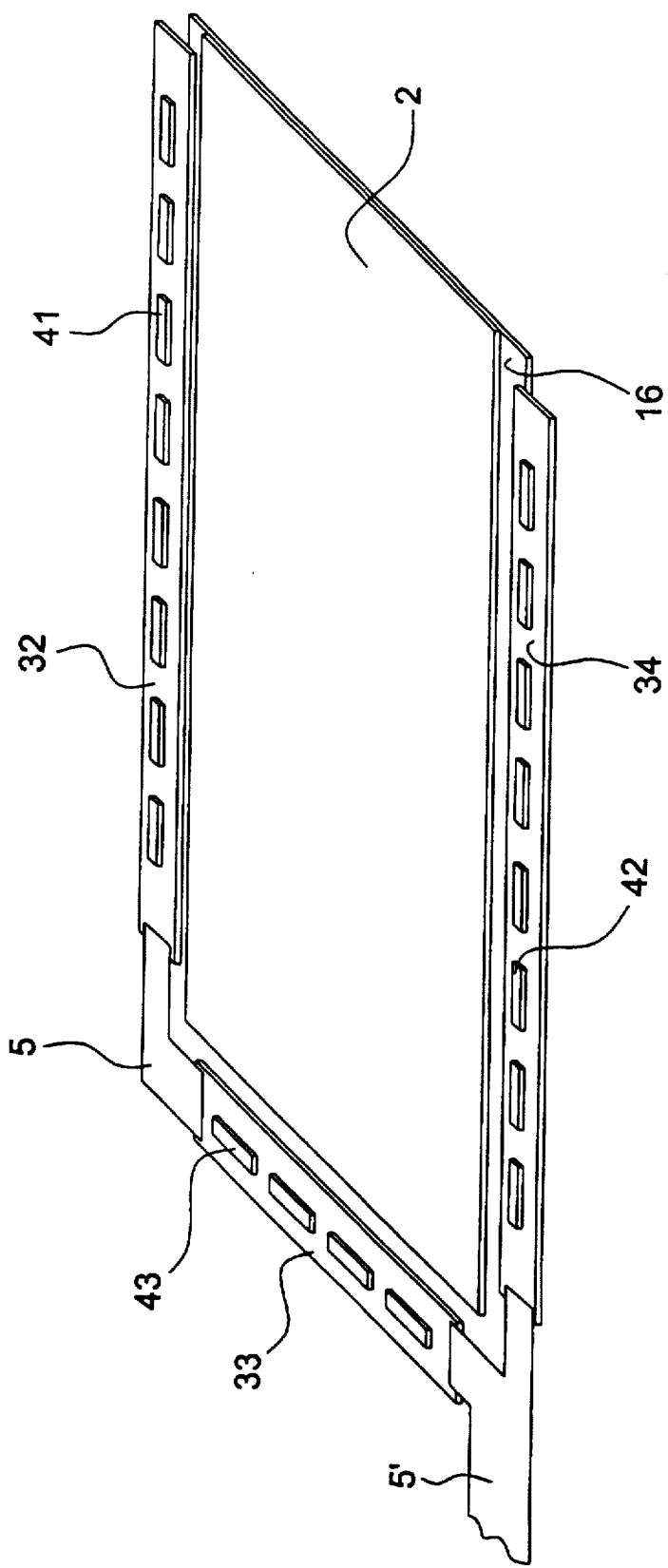
FIG. 11 is a perspective view of a liquid crystal display wherein a circuit board, on which a large number of LCD driving LSIs are mounted, is connected to the peripheral part of an LCD cell.

Furthermore, in accordance with the present invention, a large number of semiconductor devices can be simultaneously mounted in a connecting process by mounting three or more semiconductor devices on a single circuit board. Such a preferred embodiment of the present invention is shown in FIG. 11. As shown in this figure, long and narrow band-like circuit boards 32 to 34 are connected to the top, bottom, and left sides of the peripheral portion of an LCD cell 2, respectively. Further, eight X-side driving LSIs 41 and 42 are mounted on each of the circuit boards 32 and 34 and four Y-side driving LSIs 43 are mounted on the circuit board 33 in such a manner that the driving LSIs are mounted on one of the surfaces of each of these circuit boards in the longitudinal direction in line serially.

Each of the circuit boards 32 to 34 has nearly the same configuration as of the embodiment of FIG. 10. On the LSI mounting surface, the pattern of input lines connected to input terminals of the sets provided on the left and right sides thereof and the pattern of input bus lines for connecting adjoining LSIs with each other are formed. On the surface opposite to the LSI mounting surface, output terminals of each of the LSIs are formed along one of the sides thereof in the longitudinal direction. Therefore, each of the circuit boards 32 to 34 is easily connected to the electrode substrate 16 by using an ACF between the output terminals and the electrode substrate 16.

Further, a link substrate 5 is provided on an upper left corner portion of the LCD cell 2. The link substrate 5 interconnects the X-side circuit board 32 and the Y-side circuit board 33 through the input terminals. On the lower left corner portion of the LCD cell 2, a link substrate 5' integral with a cable extending to the outside is provided in such a manner so as to connect the lower X-side circuit board 34 with the Y-side circuit board 33. Thus, electric power, input signals, and so forth can be supplied from an external circuit to each of the circuit boards. Further, no input terminals may be provided on the right or left side portion of the X-side circuit boards 32 and 34 to which the Y-side circuit boards are not connected.

Figure 22:
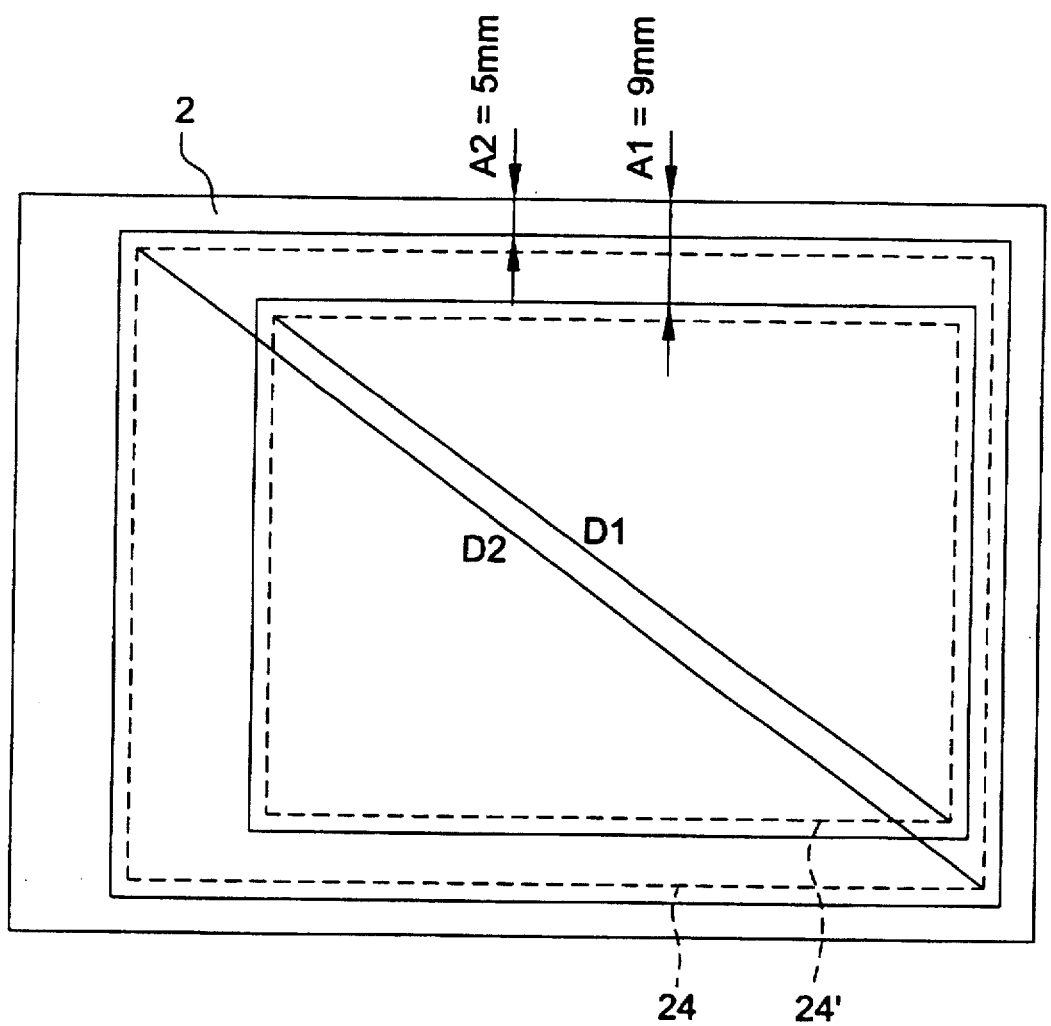
FIG. 22 is a plan view of the displaying portion and the death area of a liquid crystal display.

In accordance with the present invention, a large number of liquid crystal driving LSIs are mounted by connecting a circuit board to and along each of the sides of an LCD cell. Thereby, the number of man-hours can be reduced and operations can be facilitated. Consequently, productivity can be increased and manufacturing cost can be reduced. Further, similar to the case of each of the aforementioned embodiments, the mounting area of the liquid crystal display can be reduced drastically, as compared with conventional arrangements. For example, as illustrated in FIG. 22, where a 20-cm (i.e. 8-inch) liquid crystal panel is manufactured by using the mounting structure of the present invention, the size of a frame portion, i.e. a death area formed in the peripheral portion, can be reduced from the conventional width of 9 mm to the width 5 mm even when the outside dimension of the panel is maintained. Thereby, with liquid crystal panels having the same outside dimension, the size of the displaying portion can be increased from D1=20 cm to D2=22 cm (namely, 8.7 inches). Thus, the displaying area can be enlarged substantially.

Further, this embodiment can be configured so that a circuit board 35 can have output terminals on the LSI mounting surface thereof similar to the first embodiment of FIG. 2. In such a case, two liquid crystal LSIs can be similarly mounted on the circuit board.

Figure 12:
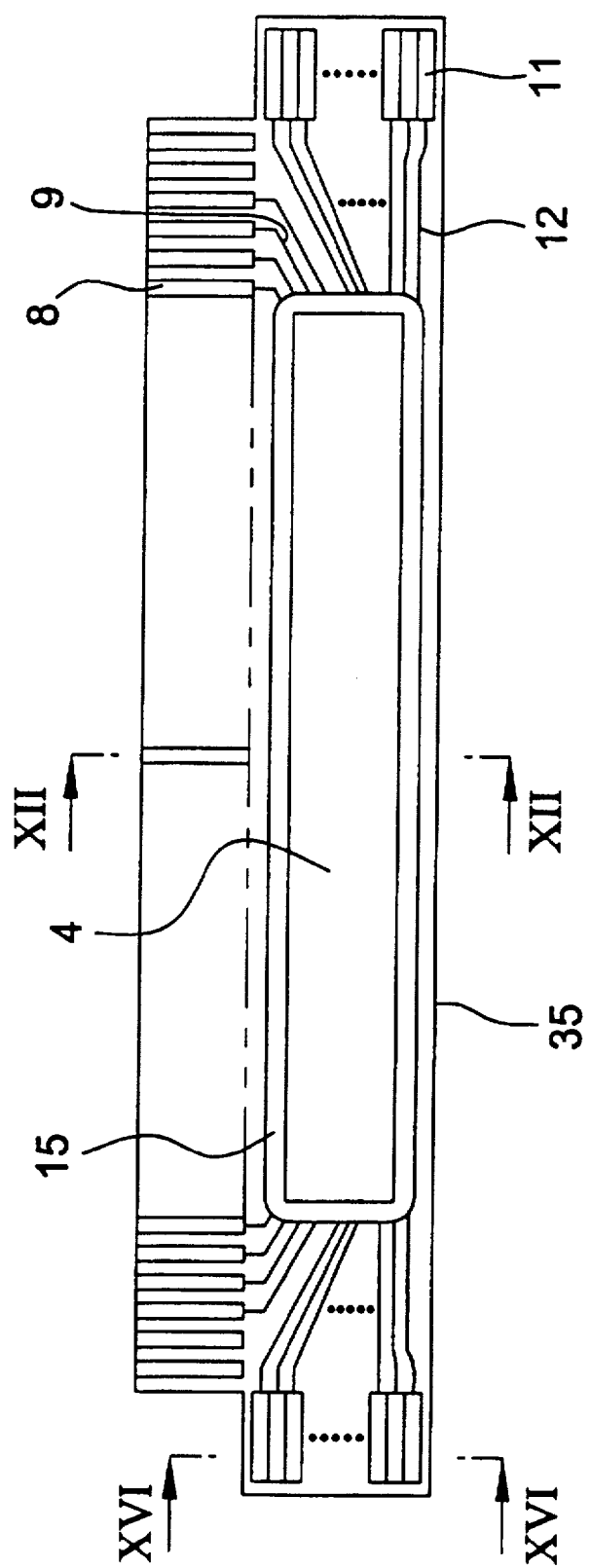
FIG. 12 is a plan view of a circuit board to be used in the structure of a fourth embodiment of the present invention for mounting semiconductor devices.
Figure 13:
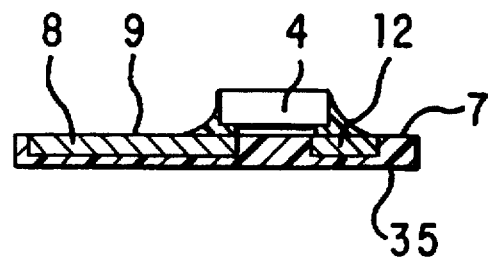
FIG. 13 is a sectional view of the circuit board, taken on line XII—XII of FIG. 12.

FIGS. 12 and 13 show a circuit board 35 of a structure for mounting semiconductor devices according to a fourth embodiment of the present invention. The circuit board 35 of this embodiment is shaped like a long and narrow rectangle similar to the aforesaid first to third embodiments. The pattern of output terminals 8, output lines 9, input terminals 11, and input lines 12 is formed on the mounting surface 7 of the LCD driving LSI 4. Thus, the circuit board of this embodiment has no via holes. The circuit board of this embodiment is different in this respect from those of the first to third embodiments. In this way, the configuration of the circuit board 35 itself can be extremely simplified and the manufacturing cost can be further decreased by using no via holes for connecting output or input lines with output or input terminals.

Further, a set of input terminals of the LSI 4 and input terminals 11 of an equal number are provided on each of the left and right side portions of the circuit board 35 and are connected to the LSI input terminals through the input lines 12, respectively. The input bus lines for connecting another adjoining circuit board therewith and thereby permitting simultaneous communication with another circuit board are formed by the input lines 12 for interconnecting the input terminals provided on the left and right side portions. Furthermore, similar to the aforementioned embodiments, a cascade connection, in which an output of the LSI corresponding to a signal input from the input line 12 provided on the left side thereof is sent to an LSI of another circuit board through the input line provided on the right side portion thereof and is further output therefrom, can be incorporated into this embodiment.

Figure 14:
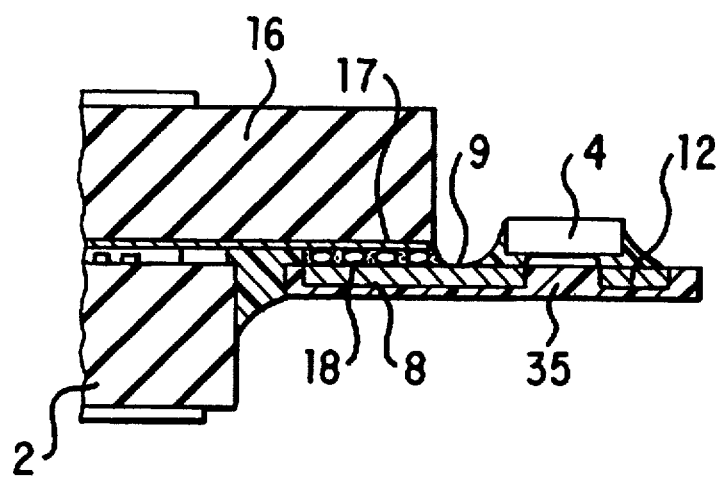
FIG. 14 is a sectional diagram for illustrating how the circuit board of the fourth embodiment is connected to an LCD cell.

As illustrated in FIG. 14, the circuit board 35 of this embodiment is connected with the LCD terminal 17 of the electrode substrate 16 at the output terminal 8 by using the ACFs 18 similarly as in each of the prior embodiments. Further, the LSI 4 is provided on the side of the electrode substrate 16 within the range of the thickness of the substrate 16 by connecting the circuit board 35, which has the LSI 4 and the output terminals 8 on the same surface thereof, to the LCD cell 2. Thus, the thickness of the entire liquid crystal display can be decreased.

Figure 15:
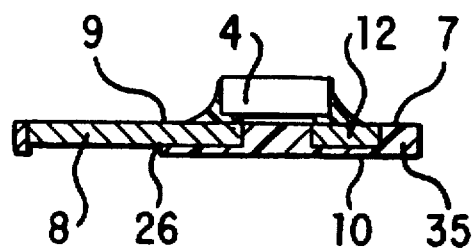
FIG. 15 is a sectional diagram for illustrating an example of the modification of the circuit board of the fourth embodiment, similarly as in the case of FIG. 13.

Further, the circuit board 35 of the present invention is formed in such a manner that the input terminals 8, the output lines 9, the input lines 12, and the input terminals 11 are buried under the surface of the LSI mounting surface 7, as illustrated in FIG. 13. Therefore, the surface of the output terminals 8, which is on the back surface side 10 of the circuit board 35, can be exposed by deleting a part of the back surface 10 to form a window portion 26, as illustrated in, for example, FIG. 15.

Figure 16:
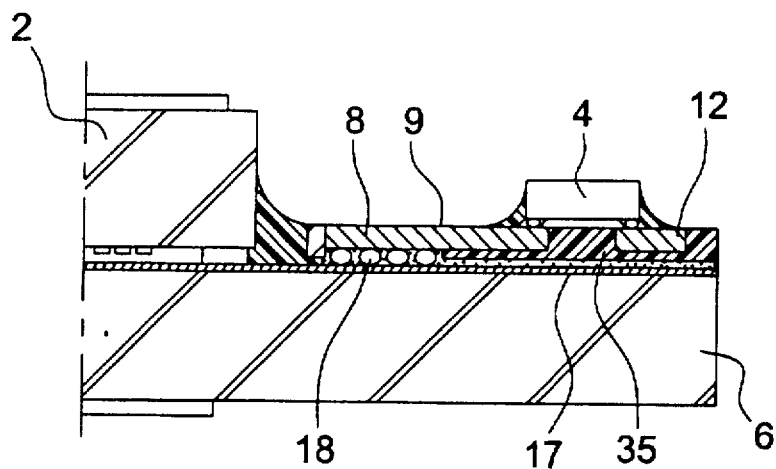
FIG. 16 is a sectional diagram for illustrating how the circuit board of FIG. 15 is connected to an LCD cell.

The circuit board 35 can be connected to the LCD terminal 17 of the electrode substrate 16 through the back surface 10, as illustrated in FIG. 16, by exposing the output terminals 8 on both of the top and bottom surface sides of the circuit board 35. In this case, the entire surface of the circuit board 35 can be bonded onto the electrode substrate 16. Consequently, the circuit board can be fixed more securely and stably. The window portion 26 of the circuit board 35 can be easily formed by, for instance, eliminating a part of the back surface 10 selectively by means of, for example, excimer laser processing.

Figure 17:
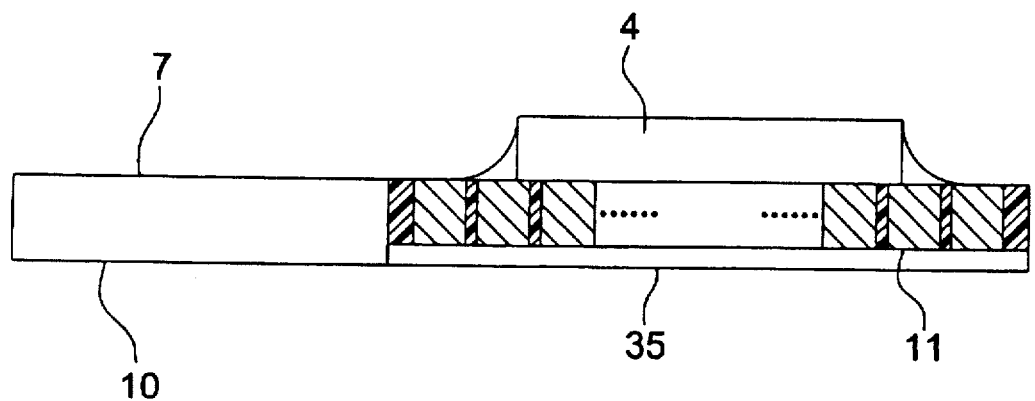
FIG. 17 is a sectional view of a circuit board, which is another example of the modification of the fourth embodiment, taken on line XVI—XVI of FIG. 12.
Figure 18A:
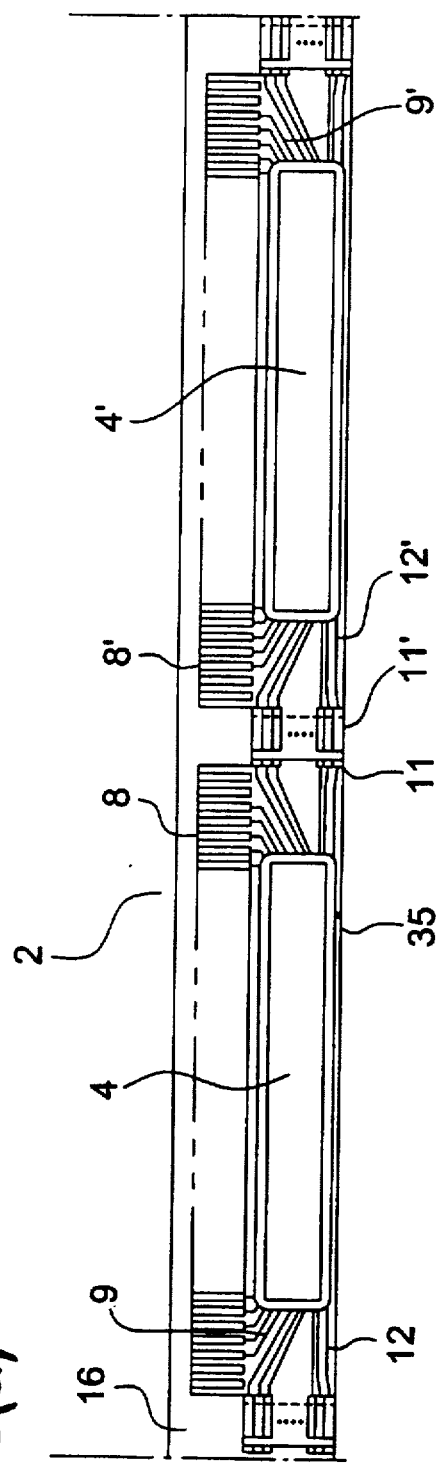
FIGS. 18(a) and 18(b) are a plan view and a side view for illustrating how adjoining circuit boards are connected with one another when a plurality of circuit boards of the modification of FIG. 17 are connected to an LCD cell.
Figure 18B:
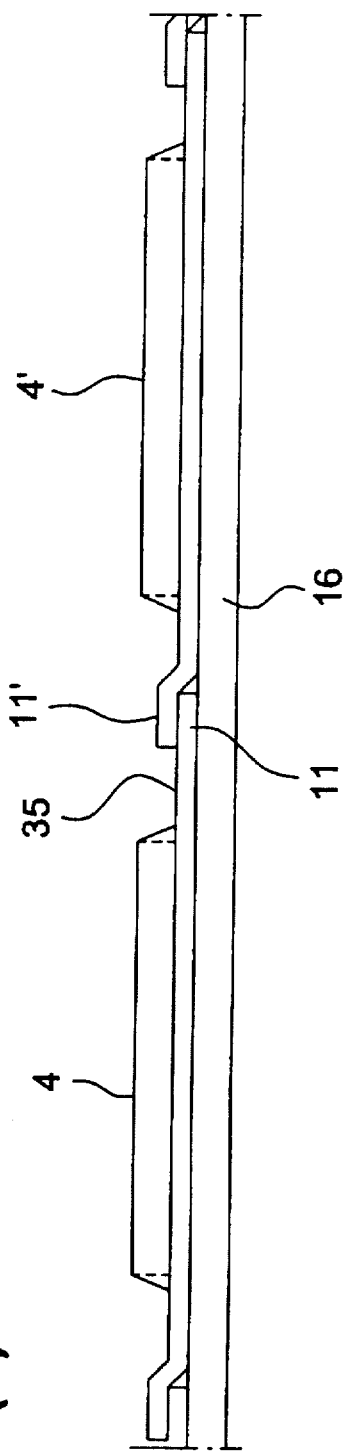

Another embodiment of the circuit board 35, in which a window portion is bored, is shown in FIG. 17. In the case of the circuit board 35 of the fourth embodiment, the input terminals 11 are provided thereon and the left and right side portions are protruded outwardly therefrom, as illustrated in FIG. 12. In the modification of FIG. 17, the input terminals 11 are exposed on the back surface 10 by deleting the left and right side portions of the back surface 10. Where a plurality of the circuit boards 35 are mounted side by side to the peripheral portion of the LCD cell 2 by exposing the input terminals 11 on both of the top and bottom surface sides of each of the circuit boards 35, the adjacent input terminal portions 11 are overlapped, as illustrated in FIG. 18, and can be connected with each other by using ACFs soldering, or the like. In the present embodiment there is no necessity of employing wire bonding or an FPC, and in this respect, the present embodiment is different from the aforementioned first and second embodiments. Thus, a connecting operation can be easily achieved, reliability of the connection portion can be increased, and the number of components can be decreased. Consequently, cost can be reduced.

Figure 19A:
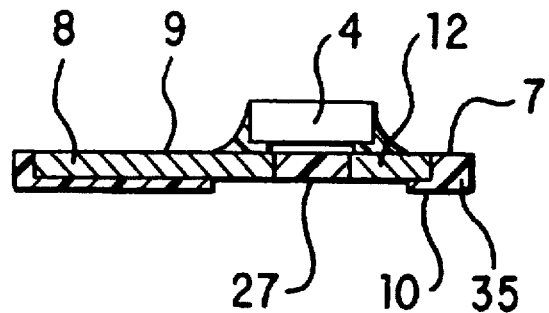
FIGS. 19(a) to 19(c) are sectional views of other examples of the modification of the circuit board of the fourth embodiment.
Figure 19B:
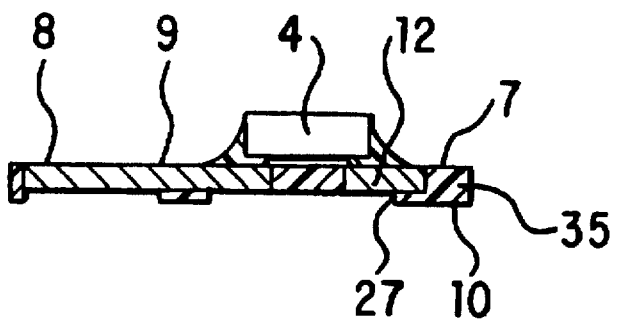
Figure 19C:
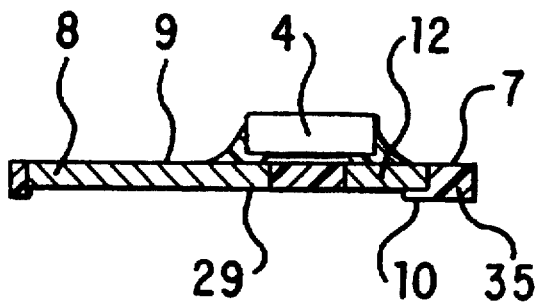

FIGS. 19(a) to 19(c) illustrate other examples of the modification of the circuit board of the fourth embodiment, respectively. In the circuit board 35 of FIG. 19(a), the window portion 27 is provided in a region of the back surface 10 corresponding to the LSI 4. Further, in the circuit board of FIG. 19(b), a window portion 28 for exposing the output terminals 8, similar to the embodiment as in the case of FIG. 14, is bored and formed in addition to the window portion 27 of FIG. 19(a). In the circuit board of FIG. 19(c), a window portion 29 for exposing nearly the entire back surface 10 of the circuit board containing the output terminals 8, the output lines 9, and the input lines 12 is provided. In these examples, as a result of providing a window portion corresponding to an area on which the LSI 4 is mounted in the back surface 10 of the circuit board 35, a heating tool can be applied directly to the input lines 12 and the output lines 9 when mounting the LSI 4 on the circuit board 35. Consequently, the input and output terminals of the LSI 4 can be easily connected to the input and output lines 12 and 9, respectively, by performing gang bonding.

Figure 20:
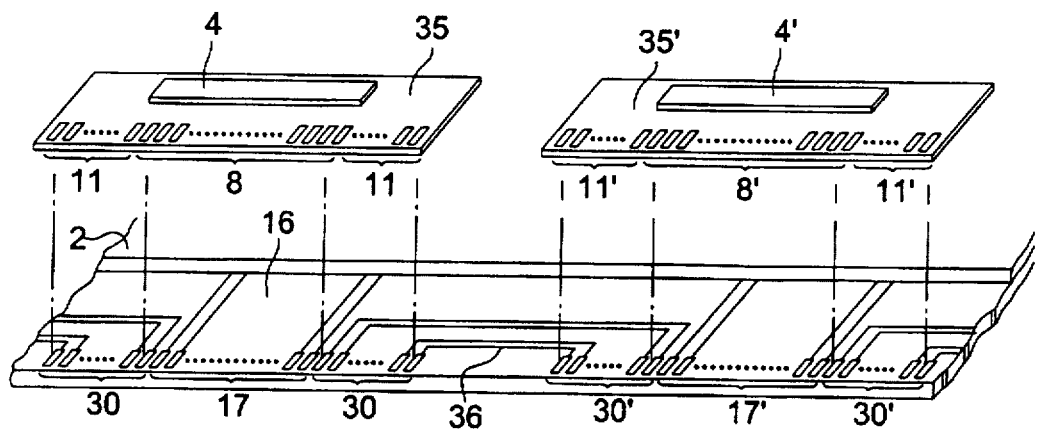
FIG. 20 is a perspective view of a further embodiment of the present invention for connecting a plurality of circuit boards to an LCD cell.
Figure 21:
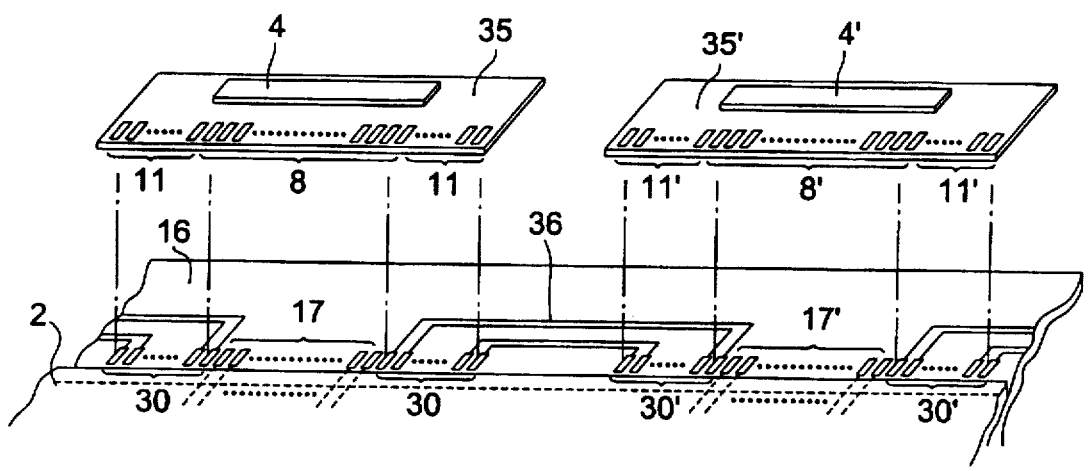
FIG. 21 is a perspective view of an example of the modification of the embodiment of FIG. 20.

In FIGS. 20 and 21, other configurations for connecting the circuit board 35 of the fourth embodiment with the LCD cell 2 are illustrated, respectively. In the embodiment of FIG. 20, the input terminals 11 are placed along one of the sides of the circuit board 35 in the longitudinal direction on both the left and right sides of the row of the output terminals 8, instead of both the left and right sides of the circuit board 35. In the back surface opposite to the LSI mounting surface 7 of the circuit board 35, a window portion (not shown) for exposing the output terminals 8 and the input terminals 11 is bored, similar to the embodiment of FIG. 17.

In the peripheral portion of the electrode substrate 16 of the LCD cell 2, in addition to the pattern of the LCD terminal 17 connected to the X-electrode or Y-electrode, the patterns of panel connecting terminals 30 are similarly formed at positions corresponding to the input terminals 11 of the circuit board 35 along the circumferential edge of the electrode substrate 16. Moreover, on the electrode substrate 16, in order to connect the circuit board with another adjoining circuit board 35', the patterns of the LCD terminals 17' and the panel connecting terminals 30' are similarly formed along the circumferential edge of the electrode substrate 16.

The panel connecting terminals 17 of the circuit board 35 are interconnected with the panel connecting terminals 17 of the adjacent circuit board 35', respectively, through bus lines 36, the pattern of which is formed on the electrode substrate 16. Therefore, the input terminals 11 and 11' of both of the circuit boards 35 and 35' are simultaneously interconnected when the circuit boards 35 and 35' are connected with the electrode substrate 16 by positionally corresponding the output terminals 8 and 8' and the input terminals 11 and 11' thereof to the corresponding LCD terminals 17 and 17' and the corresponding panel connecting terminals 30 and 30', respectively, and by then performing thermocompression bonding thereon by use of, for example, ACFs.

Thus, in this embodiment, the adjoining circuit boards are connected with each other and the input bus lines are also connected with each other only by mounting each of the circuit boards in the electrode substrate without using wire bonding and an FPC. Therefore, this embodiment has advantages in that a connecting operation can be facilitated and the number of man-hours can be reduced. Moreover, the output terminals 8 and the input terminals 11 of the circuit board 35 are placed in line so that a pressuring head can have a simple linear shape, and thus, a bonding apparatus can have a simple configuration.

Further, the embodiment of FIG. 20 employs a circuit board having the same configuration as illustrated in FIG. 17 in which a window portion is bored in the back surface of the circuit board to expose the input and output terminals. However, as long as at least the output terminals and the input terminals are provided on the same surface, a circuit board having another configuration may be provided. For example, the circuit board having a configuration of FIG. 12, the back surface of which has no window portion, may be used. In this case, the circuit board 35 is connected to the electrode substrate 35 in such a manner that the LSI 4 is placed on the side of the electrode substrate 16 and in the range of the thickness thereof, as in the case of FIG. 14.

In the embodiment of FIG. 21, each of the LCD terminals 17 and the panel connecting terminals 30 is placed in the inside of the electrode substrate 16. The pattern of bus lines 36 is formed outside such terminals. The circuit board 35 has the same configuration as that of the embodiment of FIG. 20 and is connected to the electrode substrate 16 by using an ACF or the like.

In this embodiment, the length of the line drawn from the LCD terminal 17 to the X-electrode or Y-electrode of the LCD cell 2 becomes shorter than that of the embodiment of FIG. 20. Thus, this embodiment has an advantage in that the resistance of this line becomes small. Furthermore, the size of the peripheral portion of the electrode substrate 16 on which the LCD terminals and so on are formed can be smaller than that of the embodiment of FIG. 20. Incidentally, in this embodiment, it is necessary to provide a region on which a bus line is provided outside the LCD terminals 17 and the panel connecting terminals 30 in the peripheral portion of the electrode substrate 16. Therefore, it is difficult to connect the circuit boards of FIG. 13, which have no window portion on the back surface thereof, with each other, as in the embodiment of FIG. 20.

In the foregoing description, a case in which the structure of the present invention for mounting semiconductor devices is applied to a liquid crystal display employed as an electronic apparatus has been described. The present invention, however, can be similarly applied to other electronic display apparatuses, such as an EL (electroluminescence) display, a plasma display, and to an electronic printer, such as a thermal printer.

Figure 23:
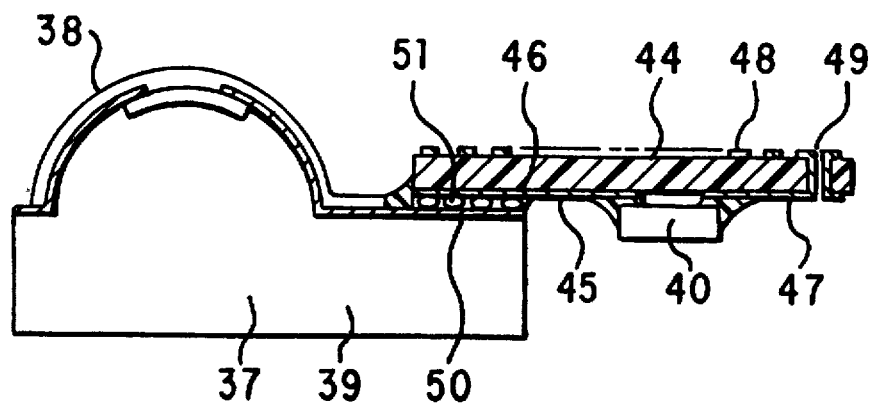
FIG. 23 is a sectional view of an electronic printer in which a driving LSI is mounted by applying the first embodiment of the present invention.
Figure 24:
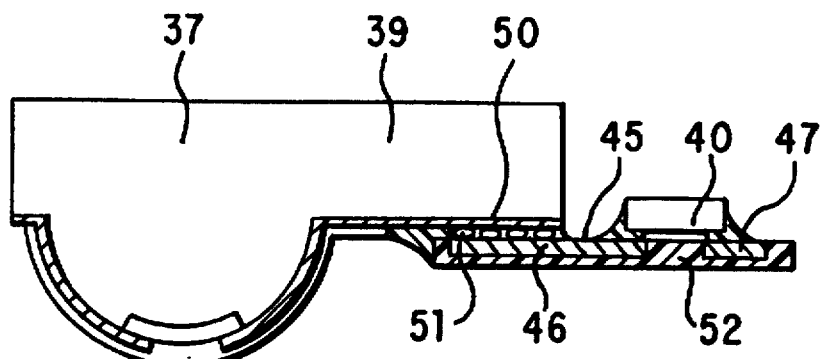
FIG. 24 is a sectional view of an electronic printer using the circuit board of the fourth embodiment, similarly as in the case of FIG. 23.
Figure 25:
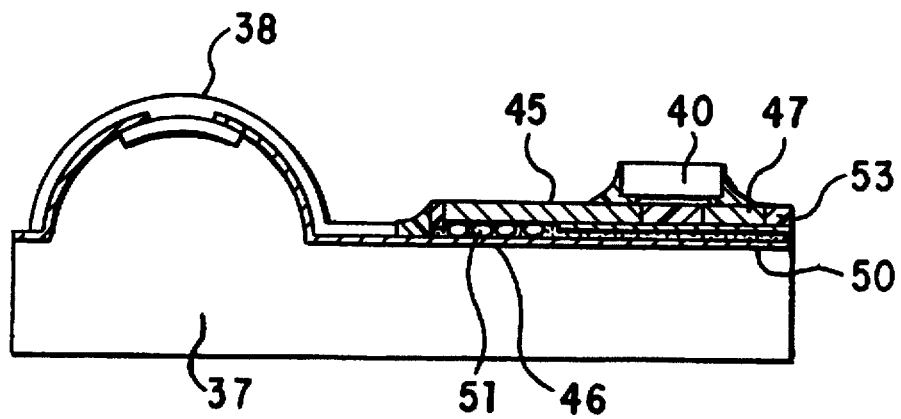
FIG. 25 is a sectional view of an electronic printer using the circuit board of FIG. 15, which is the example of the modification of the fourth embodiment.
Figure 26:
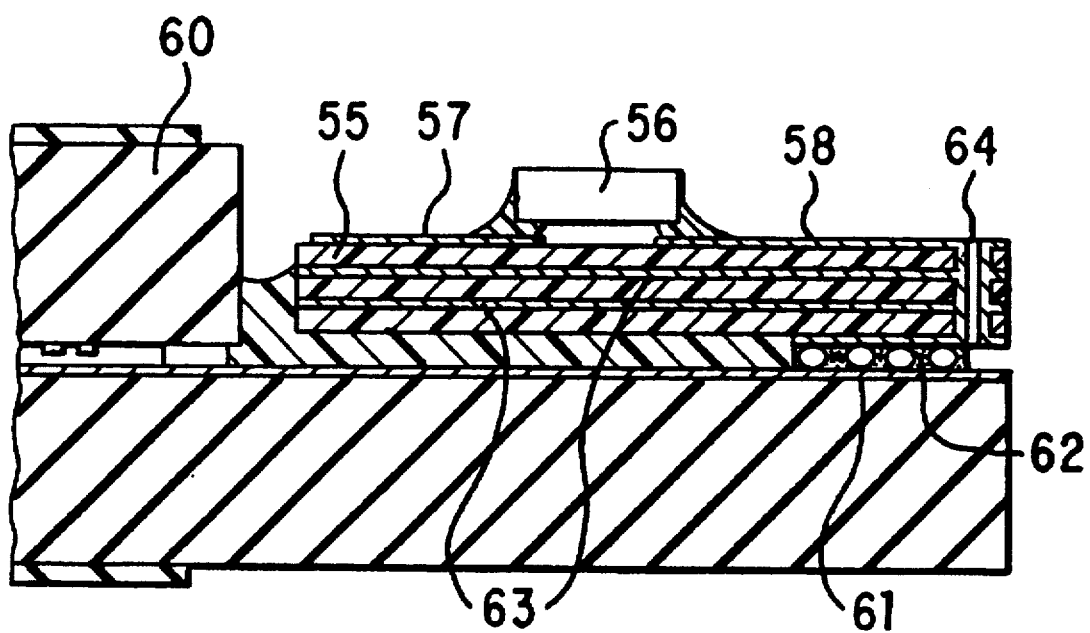
FIG. 26 is a sectional diagram for illustrating the structure for mounting a semiconductor device using a prior art multilayer circuit board.
Figure 27:
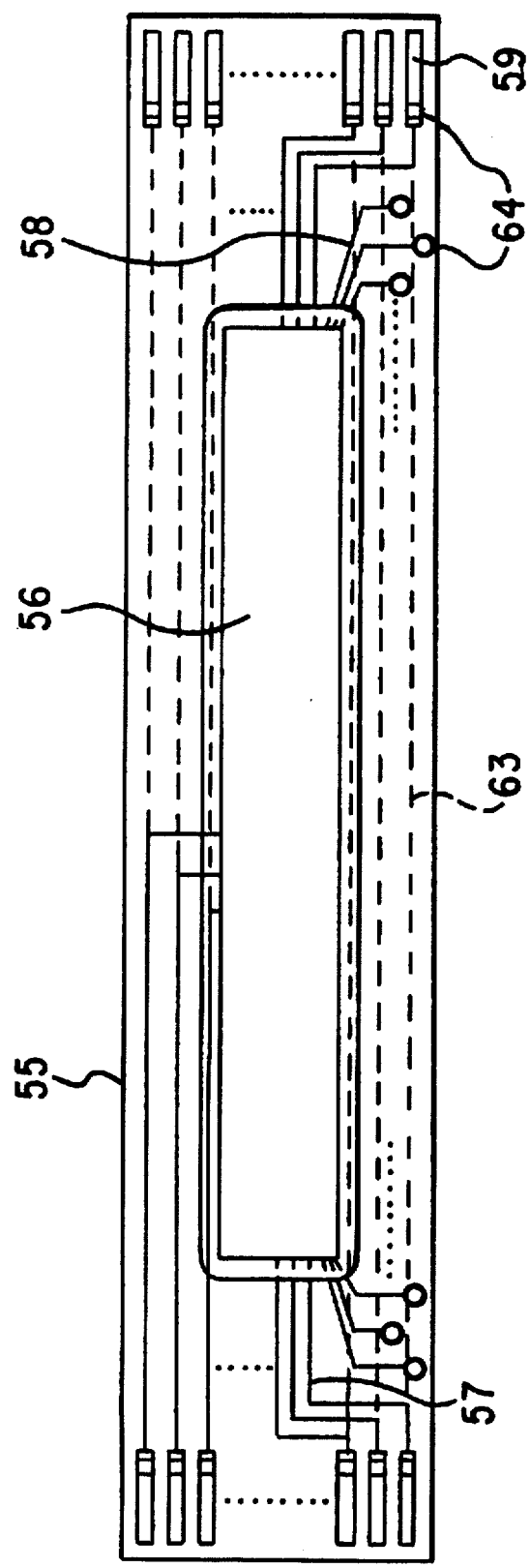
FIG. 27 is a plan view of the circuit board of FIG. 26.

FIGS. 23 to 25 illustrate embodiments of the structure for mounting driving LSIs in a thermal printer head used as an electronic printer. In the embodiment of FIG. 23, a circuit board 44 on which a driving LSI 40 is mounted is connected onto a ceramic substrate 39 on which a heating portion 38 is formed in a thermal printer head 37. The circuit board 44 has a configuration similar to that of the circuit board 3 of FIG. 1. Further, an output line 45, an output terminal 46, and an input line 47 are formed on the surface on which the driving LSI 40 is mounted of the circuit board 44. In contrast, an input bus line for connecting the circuit board 44 with an LSI of a circuit board adjoining the input terminal 48 is formed on the opposite surface thereof. Moreover, the input terminal 48 and the input line 47 are connected with each other through a via hole 49. The circuit board 44 is electrically and mechanically connected with the head 37 by positionally corresponding a thermal printer head terminal 50 formed on the substrate 39 of the thermal printer head 37 to the output terminal 46 through thermocompression bonding by means of an ACF 51.

In the embodiment of FIG. 24, a circuit board 52 has a configuration similar to that of the circuit board 35 of FIG. 12. Moreover, the circuit board 52 is connected with the substrate 39 of the thermal printer head 37, similar to the case of FIG. 14. Furthermore, in the embodiment of FIG. 25, a circuit board 53 has a configuration similar to that of the circuit board 35 of FIG. 15. Moreover, similar to the case of FIG. 16, the circuit board 53 is connected with the substrate 39 of the thermal printer head 37.

Thus, in accordance with the structure of the present invention for mounting semiconductor devices, in cases of applying such a structure not only to an electronic display but to other various electronic devices, such as an electronic printer, the mounting area can be very small. Moreover, the thickness of the entire device can be small. Consequently, the present invention can respond to the demand for the downsizing of electronic devices and can realize a compact electronic device in which the death area is very small.

What is claimed is:

1. A structure for mounting semiconductor devices in an electronic apparatus, the structure comprising:

a plurality of circuit boards on each of which at least one of the semiconductor devices is mounted, each of the circuit boards having: a) two sets of input lines and a set of output lines which are connected to the at least one of the semiconductor devices; b) two sets of input terminals connected to the two sets of input lines, respectively; c) a set of output terminals connected to the set of output lines, respectively; and d) input bus lines interconnecting the two sets of input terminals, wherein the set of output lines, the set of output terminals and the two sets of input lines are formed on a first surface of each of the circuit boards, and the two sets of input terminals and the input bus lines are formed on a second surface of each of the circuit boards opposite to the first surface, each of the input terminals is connected to a corresponding one of the input lines through a via hole, each of the circuit boards is mounted in the electronic apparatus by connecting the set of output terminals thereof to corresponding terminals of the electronic apparatus, and each of the circuit boards is connected to an adjoining one of the circuit boards by electrically connecting at least one of the two sets of input terminals with at least one of the two sets of input terminals of the adjoining one of the circuit boards.

2. The structure for mounting semiconductor devices according to claim 1, wherein the at least one of the two sets of input terminals of each of the circuit boards are connected to the at least one of the two sets of input terminals of the adjoining one of the circuit boards through wire bonding.

3. The structure for mounting semiconductor devices according to claim 1, wherein the at least one of the two sets of input terminals of each of the circuit boards are connected to the at least one of the two sets of input terminals of the adjoining one of the circuit boards by a flexible printed circuit.

4. The structure for mounting semiconductor devices according to claim 1, wherein the set of output terminals of each of the circuit boards is connected to the corresponding terminals of the electronic apparatus through an anisotropic conductive film.

5. A structure for mounting semiconductor devices in an electronic apparatus, the structure comprising:

a plurality of circuit boards on each of which at least one of the semiconductor devices is mounted, each of the circuit boards having:

a) two sets of input lines and a set of output lines which are connected to the at least one of the semiconductor devices;

b) two sets of input terminals connected to the two sets of input lines, respectively;

c) a set of output terminals connected to the set of output lines, respectively; and d) input bus lines interconnecting the two sets of input terminals, wherein the set of output lines, the set of output terminals and the two sets of input lines are formed on a first surface of each of the circuit boards, and the two sets of input terminals and the input bus lines are formed on a second surface of each of the circuit boards opposite to the first surface, each of the input terminals is bonded to a corresponding one of the input lines through a via hole, corresponding lines of one set of input lines are connected through the at least one semiconductor device to corresponding lines of the other set of input lines, each of the circuit boards is mounted in the electronic apparatus by bonding the set of output terminals thereof to corresponding terminals of the electronic apparatus, and each of the circuit boards is connected to an adjoining one of the circuit boards by electrically connecting at least one of the two sets of input terminals with at least one of the two sets of input terminals of the adjoining one of the circuit boards.

6. The structure for mounting of the semiconductor devices according to claim 5, wherein the at least one of the two sets of input terminals of each of the circuit boards is connected to the at least one of the two sets of input terminals of the adjoining one of the circuit boards through wire bonding.

7. The structure for mounting semiconductor devices according to claim 5, wherein the at least one of the two sets of input terminals of each of the circuit boards is connected to the at least one of the two sets of input terminals of the adjoining one of the circuit boards by a flexible printed circuit.

8. The structure for mounting semiconductor devices according to claim 5, wherein the set of output terminals of each of the circuit boards is connected to the corresponding terminals of the electronic apparatus through an anisotropic conductive film.

9. A structure for mounting semiconductor devices in an electronic apparatus, the structure comprising:

a plurality of circuit boards on each of which at least one of the semiconductor devices is mounted, each of the circuit boards having: a) two sets of input lines and a set of output lines which are connected to the at least one of the semiconductor devices; b) two sets of input terminals connected to the two sets of input lines, respectively; c) a set of output terminals connected to the set of output lines, respectively; and d) input bus lines interconnecting the two sets of input terminals, wherein the set of output lines, the set of output terminals and the two sets of input lines are formed on a first surface of each of the circuit boards, the input bus lines are formed by the two sets of input lines connected to one another through the at least one of the semiconductor devices, each of the circuit boards is mounted in the electronic apparatus by bonding the set of output terminals thereof to corresponding terminals of the electronic apparatus, and each of the circuit boards is connected to an adjoining one of the circuit boards by electrically connecting at least one of the two sets of input terminals with at least one of the two sets of input terminals of the adjoining one of the circuit boards.

10. The structure for mounting semiconductor devices according to claim 9, wherein each of the circuit boards is mounted in the electronic apparatus by exposing the set of output terminals on the first surface and connecting the exposed set of output terminals to the corresponding terminals of the electronic apparatus.

11. The structure for mounting semiconductor devices according to claim 9, wherein each of the circuit boards is connected to the adjoining one of the circuit boards by exposing at least one set of input terminals on a second surface opposite to the first surface, and the at least one set of input terminals exposed on the second surface and the input terminals of the adjoining one of the circuit boards overlap.

12. The structure for mounting semiconductor devices according to claim 9, wherein each of the circuit boards has a window portion for exposing the two sets of input lines and the set of output lines on the first surface, and the window portion is provided in an area where the semiconductor device is mounted.

13. The structure for mounting semiconductor devices according to claim 9, wherein at least one of the two sets of input terminals of each of the circuit boards is connected to the at least one of the two sets of input terminals of the adjoining one of the circuit boards through wire bonding.

14. The structure for mounting semiconductor devices according to claim 9, wherein the at least one of the two sets of input terminals of each of the circuit boards is connected to the at least one of the two sets of input terminals of the adjoining one of the circuit boards by a flexible printed circuit.

15. The structure for mounting semiconductor devices according to claim 9, wherein the set of output terminals of each of the circuit boards is connected to the corresponding terminals of the electronic apparatus through an anisotropic conductive film.

16. A structure for mounting semiconductor devices in an electronic apparatus, the structure comprising:

at least one circuit board on which a plurality of semiconductor devices are mounted, the at least one circuit board having:

a) a set of output lines;

b) a set of output terminals connected to the set of output lines;

c) at least one set of input lines corresponding to each of the plurality of semiconductor devices;

d) at least one set of input terminals connected to each set of input lines; and e) input bus lines connected to each set of input terminals, wherein the set of output lines, the set of output terminals and each of the sets of input lines are formed on a first surface of the circuit board, each set of input terminals and the input bus lines are formed on a second surface of the circuit board opposite to the first surface, each of the input lines of the circuit board is connected to each of the input terminals through a via hole, and the at least one circuit board is mounted in the electronic apparatus by connecting the set of output terminals to corresponding terminals of the electronic apparatus.

17. The structure for mounting semiconductor devices according to claim 16, comprising a plurality of the circuit boards, wherein each of the circuit boards is connected to an adjoining one of the circuit boards by electrically connecting at least one of the sets of input terminals with at least one of the sets of input terminals of the adjoining one of the circuit boards.

18. A structure for mounting semiconductor devices in an electronic apparatus, the structure comprising:

at least one circuit board on which a plurality of semiconductor devices are mounted, the at least one circuit board having: a) a set of output lines; b) a set of output terminals connected to the set of output lines; c) at least one set of input lines corresponding to each of the semiconductor devices; d) at least one set of input terminals connected to each set of input lines; and e) input bus lines connected to each set of input terminals, wherein each set of input lines, each set of input terminals and the set of output lines are formed on a first surface of each of the circuit boards and the set of output terminals are formed on a second surface of the circuit boards opposite to the first surface, each of the output lines is bonded to a corresponding one of the output terminals through a via hole, the input bus lines are formed by the sets of input lines connected to one another through the semiconductor devices, and the at least one circuit board is mounted in the electronic apparatus by connecting the set of output terminals to corresponding terminals of the electronic apparatus.

19. The structure for mounting semiconductor devices according to claim 18, comprising a plurality of the circuit boards, wherein each of the circuit boards is connected to an adjoining circuit boards by electrically connecting at least one the sets of input terminals with at least one of the sets of input terminals of the adjoining one of the circuit boards.

20. A structure for mounting semiconductor devices in an electronic apparatus, the structure comprising:

at least one circuit board on which a plurality of semiconductor devices are mounted, the circuit board having: a) a set of output lines; b) a set of output terminals connected to the set of output lines; c) a set of input lines correspondingly to each of the semiconductor devices; d) a set of input terminals connected to each of the sets of input lines; and e) input bus lines connected to each of the sets of input terminals, wherein each of the sets of input lines, each of the sets of input terminals and the set of output lines are formed on a first surface of the at least one circuit board, the output terminals are formed on a second surface of the at least one circuit board opposite to the first surface, the input bus lines are formed by the sets of input lines connected to one another through the semiconductor devices, and wherein the at least one circuit board is mounted in the electronic apparatus by connecting the output terminals to corresponding terminals of the electronic apparatus.

21. The structure for mounting semiconductor devices according to claim 20, further comprising a plurality of circuit boards, wherein each of the circuit boards is connected to an adjoining one of the circuit boards by electrically connecting at least one of the sets of input terminals with at least one of the sets of input terminals of the adjoining one of the circuit boards.

22. A method for mounting semiconductor devices in an electronic apparatus, the method comprising the steps of:

preparing a circuit board by providing on a first surface thereof an input line, an output line, and one of input and output terminals and providing the other of the input and output terminals on a second surface of the circuit board opposite to the first surface, connecting the other of the input and output terminals to a corresponding one of the input and output lines through a via hole, providing the input terminals and the input bus line on a same surface of the circuit board; and mounting the circuit board with at least one of the semiconductor devices mounted thereon in the electronic apparatus by connecting an output terminal with a corresponding terminal of the electronic apparatus.

23. The method for mounting semiconductor devices according to claim 22, wherein the circuit board mounting step comprises placing an anisotropic conductive film between the output terminal of the circuit board and the terminal of the electronic apparatus and performing thermocompression bonding of the film therebetween.

24. The method for mounting semiconductor devices according to claim 22, further comprising the step of connecting a plurality of the semiconductor devices with each other by connecting adjacent input terminals of the adjoining semiconductor devices.

25. The method for mounting semiconductor devices according to claim 24, wherein the step of connecting said plurality of semiconductor devices includes connecting terminals of adjoining circuit boards to each other through wire bonding.

26. The method for mounting semiconductor devices according to claim 24, wherein the step of connecting said plurality of semiconductor devices includes connecting adjacent input terminals of adjoining circuit boards with a flexible printed circuit.

27. A method for mounting semiconductor devices in an electronic apparatus, the method comprising the steps of:

preparing a circuit board by providing on a first surface thereof input and output lines, at least two input terminals, an output terminal, and an input bus line connecting the at least two input terminals; and mounting the circuit board with at least one of the semiconductor devices mounted thereon in the electronic apparatus by connecting an output terminal with a corresponding terminal of the electronic apparatus.

28. The method for mounting semiconductor devices according to claim 27, wherein the circuit board mounting step includes placing an anisotropic conductive film between the output terminal of the circuit board and the terminal of the electronic apparatus and performing thermocompression bonding of the film therebetween.

29. The method for mounting semiconductor devices according to claim 27, further comprising the step of connecting a plurality of the semiconductor devices with each other by connecting the adjacent input terminals of the adjoining semiconductor devices.

30. The method for mounting semiconductor devices according to claim 29, wherein the step of connecting the semiconductor devices together includes connecting the adjacent input terminals of adjoining circuit boards to each other through wire bonding.

31. The method for mounting semiconductor devices according to claim 29, wherein the step of connecting the semiconductor devices together includes connecting the adjacent input terminals of adjoining circuit boards to each other by a flexible printed circuit.

32. A liquid crystal display on which a plurality of liquid crystal driving semiconductor devices are mounted, the liquid crystal display comprising:

a plurality of circuit boards on each of which at least one of the semiconductor devices is mounted, each of the circuit boards having: a) two sets of input lines and a set of output lines which are connected to the at least one of the semiconductor devices; b) two sets of input terminals connected to the two sets of input lines, respectively; c) a set of output terminals connected to the set of output lines, respectively; and d) input bus lines interconnecting the two sets of input terminals, wherein the set of output lines, the set of output terminals and the two sets of input lines are formed on a first surface of each of the circuit boards, the two sets of input terminals and the input bus lines are formed on a second surface of each of the circuit boards opposite to the first surface, and each of the input terminals is bonded to a corresponding one of the input lines through a via hole, each of the circuit boards is mounted in the liquid crystal display by bonding the set of output terminals thereof to electrode terminals of the liquid crystal display, and each of the circuit boards is connected to an adjoining one of the circuit boards by electrically connecting at least one of the two sets of input terminals with at least one of the two sets of input terminals of the adjoining one of the circuit boards.

33. A liquid crystal display on which a plurality of liquid crystal driving semiconductor devices are mounted, the liquid crystal display comprising:

a plurality of circuit boards on each of which at least one of the semiconductor devices is mounted, each of the circuit boards having:
 a) two sets of input lines and a set of output lines which are bonded to the at least one of the semiconductor devices;
 b) two sets of input terminals bonded to the two sets of input lines, respectively;
 c) a set of output terminals bonded to the set of output lines, respectively; and
 d) input bus lines interconnecting the two sets of input terminals,
wherein the set of output lines, the set of output terminals and the two sets of input lines are formed on a first surface of each of the circuit boards, the two sets of input terminals and the input bus lines are formed on a second surface of each of the circuit boards opposite to the first surface, each of the input terminals is connected to a corresponding one of the input lines through a via hole, corresponding lines of one set of input lines are connected through the at least one semiconductor device to corresponding lines of the other set of input lines, each of the circuit boards is mounted in the liquid crystal display by connecting the set of output terminals thereof to electrode terminals of the liquid crystal display, and each of the circuit boards is connected to an adjoining one of the circuit boards by electrically connecting at least one of the two sets of input terminals with at least one of the two sets of input terminals of the adjoining one of the circuit boards.

34. A liquid crystal display on which a plurality of liquid crystal driving semiconductor devices are mounted, the liquid crystal display comprising:

a plurality of circuit boards on each of which at least one of the semiconductor devices is mounted, each of the circuit boards having: a) two sets of input lines and a set of output lines which are connected to the at least one of the semiconductor devices; b) two sets of input terminals connected to the two sets of the input lines, respectively; c) a set of output terminals connected to the set of output lines, respectively; and d) input bus lines interconnecting the two sets of input terminals,
wherein the set of output lines, the set of output terminals and the two sets of input lines are formed on a first surface of each of the circuit boards and the input bus lines are formed by the two sets of input lines connected to one another through the at least one of the semiconductor devices, each of the circuit boards is mounted in the liquid crystal display by connecting the set of output terminals thereof to electrode terminals of the liquid crystal display, and each of the circuit boards is connected to an adjoining one of the circuit boards by electrically connecting at least one of the two sets of input terminals with at least one of the two sets of input terminals of the adjoining one of the circuit boards.

35. A liquid crystal display on which a plurality of liquid crystal driving semiconductor devices are mounted, the liquid crystal display comprising:

at least one circuit board on which a plurality of semiconductor devices are mounted, the at least one circuit board having:
 a) a set of output lines;
 b) a set of output terminals connected to the set of output lines;
 c) at least one set of input lines correspondingly to each of the semiconductor devices;
 d) at least one set of input terminals connected to each of the sets of input lines, respectively; and
 e) input bus lines connected to each of the sets of input terminals,
wherein the set of output lines, the set of output terminals and each of the sets of input lines are formed on a first surface of the at least one circuit board, each of the sets of input terminals and the input bus lines are formed on second surface of the at least one circuit board opposite to the first surface, and each of the input lines of the at least one circuit board are connected to a respective one of the input terminals through a via hole, and the at least one circuit board is mounted in the liquid crystal display by connecting the set of output terminals to electrode terminals of the liquid crystal display.

36. A liquid crystal display on which a plurality of liquid crystal driving semiconductor devices are mounted, the liquid crystal display comprising:

at least one circuit board on which a plurality of semiconductor devices are mounted, the at least one circuit board having: a) a set of output lines; b) a set of output terminals connected to the set of output lines; c) at least one set of input lines corresponding to each of the semiconductor devices; d) at least one set of input terminals connected to the each of the sets of input lines, respectively; and e) input bus lines connected to the each of the sets of input terminals,
wherein each of the sets of input lines, each of the sets of input terminals and the set of output lines are formed on a first surface of the at least one circuit board and the set of output terminals are formed on a second surface of the at least one circuit board opposite to the first surface, each of the output lines is bonded to a corresponding one of the output terminals through a via hole, the input bus lines are formed by the sets of input lines connected to one another through the semiconductor devices, and the at least one circuit board is mounted in the liquid crystal display by connecting the set of output terminals to electrode terminals of the liquid crystal display.

37. A liquid crystal display on which a plurality of liquid crystal driving semiconductor devices are mounted, the liquid crystal display comprising:

at least one circuit board on which a plurality of semiconductor devices are mounted, the at least one circuit board having: a) a set of output lines; b) a set of output terminals connected to the set of output lines; c) a set of input lines corresponding to each of the semiconductor devices; d) at least one set of input terminals connected to each of the sets of input lines, respectively; and e) input bus lines connected to each of the sets of input terminals, wherein each of the sets of input lines, each of the sets of input terminals and the set of output lines are formed on a first surface of the at least one circuit board, and the set of output terminals are formed on a second surface of the at least one circuit board opposite to the first surface; the input bus lines are formed by the sets of input lines connected to one another through the semiconductor devices, wherein the at least one circuit board is mounted in the liquid crystal display by connecting the set of output terminals to electrode terminals of the liquid crystal display.

* * * * *